United States Patent
Nakamura et al.

(10) Patent No.: US 8,563,971 B2
(45) Date of Patent: Oct. 22, 2013

(54) LIGHT EMITTING DEVICE

(71) Applicant: Sony Corporation, Tokyo (JP)

(72) Inventors: Hirofumi Nakamura, Kanagawa (JP); Seong-Hee Noh, Kanagawa (JP); Jiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/852,700

(22) Filed: Mar. 28, 2013

(65) Prior Publication Data

US 2013/0228761 A1    Sep. 5, 2013

Related U.S. Application Data

(62) Division of application No. 12/840,483, filed on Jul. 21, 2010, now Pat. No. 8,426,847.

(30) Foreign Application Priority Data

Aug. 10, 2009    (JP) ................ P2009-185540

(51) Int. Cl.
*H01L 29/08*    (2006.01)

(52) U.S. Cl.
USPC ............. 257/40; 257/59; 257/79; 257/98; 257/E51.018

(58) Field of Classification Search
USPC .......... 257/40, 59, 79, 98, E51.018, E51.026
See application file for complete search history.

(56) References Cited

U.S. PATENT DOCUMENTS 7,102,282 B1    9/2006  Yamada et al.
2011/0031480 A1*  2/2011  Nakamura et al. ........... 257/40

FOREIGN PATENT DOCUMENTS

| JP | 2001-035667 | 2/2001 |
|----|-------------|--------|
| JP | 2005-209647 | 8/2005 |
| JP | 2006-338916 | 12/2006 |
| WO | 01/39554    | 5/2001 |

* cited by examiner

*Primary Examiner* — Jack Chen
(74) *Attorney, Agent, or Firm* — K&L Gates LLP

(57) ABSTRACT

A light emitting device includes: a first electrode, a conductor film, an organic layer having a light emitting layer made of an organic light emitting material provided therein, a semi-transmissive reflective film, a resistive layer, and a second electrode, all of which are laminated successively, wherein the conductor film transmits a part of light from the light emitting layer therethrough, the first electrode reflects the light having been transmitted through the conductor film, the second electrode transmits the light having been transmitted through the semi-transmissive reflective film therethrough, an average film thickness of the conductor film on the first electrode is from 1 nm to 6 nm, and an average film thickness of the semi-transmissive reflective film on the organic layer is from 1 nm to 6 nm.

8 Claims, 14 Drawing Sheets

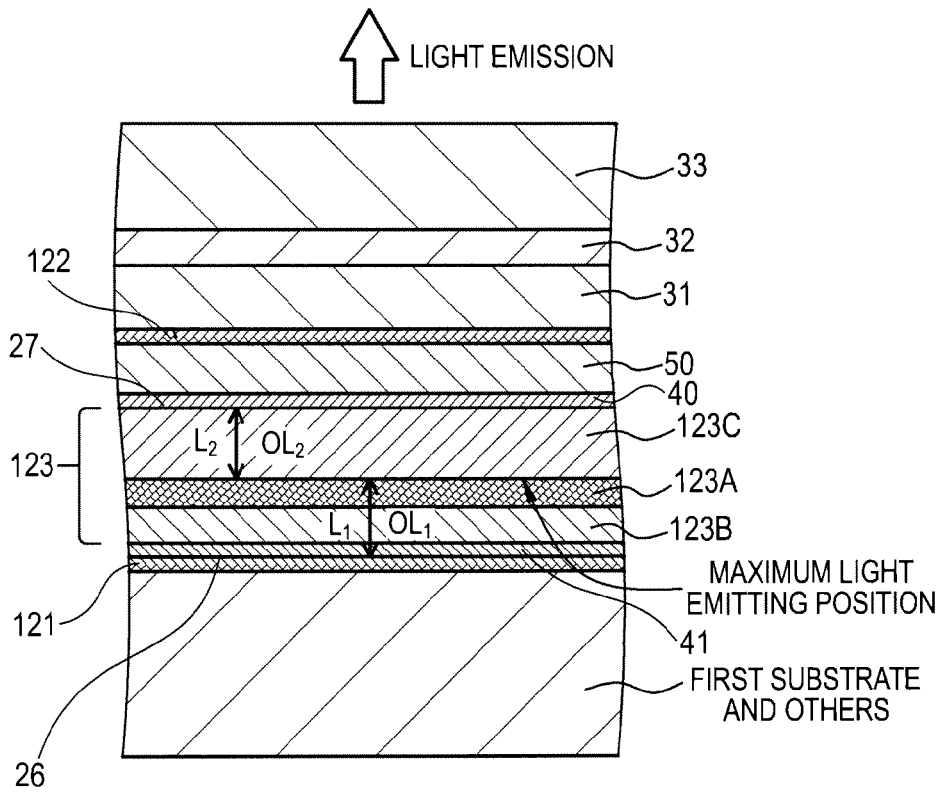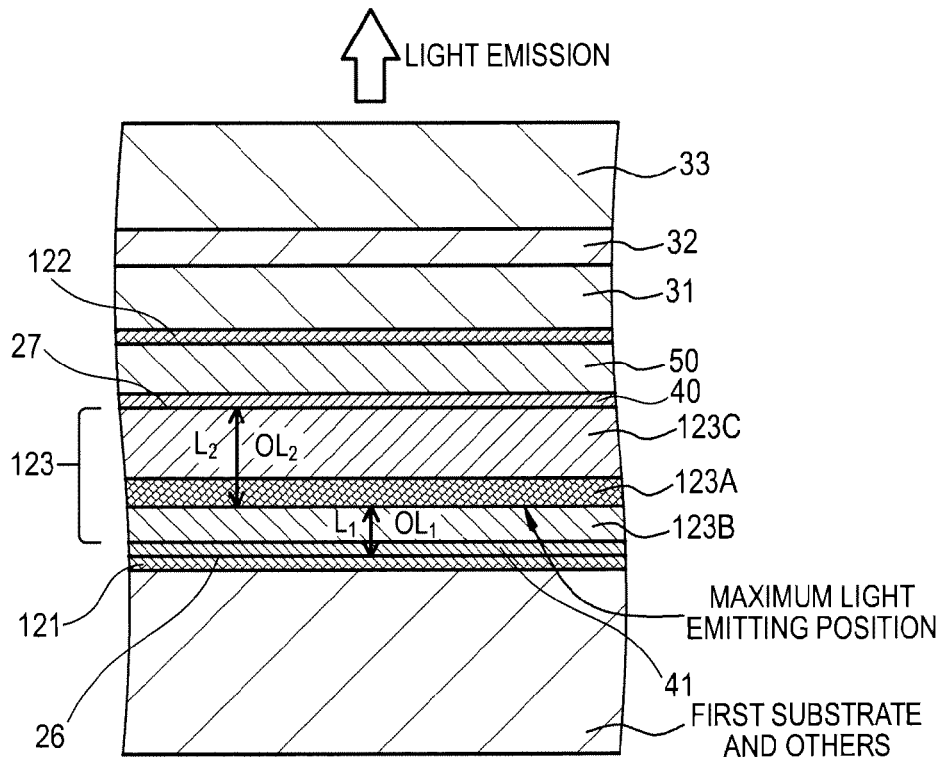

[STEP 100]

[STEP 110]

[STEP 120]

[STEP 130]

[STEP 140]

[STEP 150]

[STEP 170]

LIGHT EMITTING DEVICE

CROSS REFERENCES TO RELATED APPLICATIONS

The present application is a Divisional Application of U.S. patent application Ser. No. 12/840,483, filed Jul. 21, 2010, which claims priority to Japanese Priority Patent Application JP 2009-185540 filed in the Japan Patent Office on Aug. 10, 2009, the entire content of which is hereby incorporated by reference.

BACKGROUND

The present invention relates to a light emitting device. More specifically, the present invention relates to an organic electroluminescence light emitting device.

In recent years, attention has been paid to an organic electroluminescence display apparatus (hereinafter sometimes abbreviated simply as "organic EL display apparatus") using an organic electroluminescence device (hereinafter sometimes abbreviated simply as "organic EL device") as a display apparatus which is a replacement for a liquid crystal display apparatus. The organic EL display apparatus is a self-luminous type and has such a characteristic that a consumed electrical power is low, and it is considered to have sufficient responsiveness to high-speed video signals with a high definition. Its development and commercialization toward practical implementation are being extensively advanced.

In general, the organic EL device has a structure in which a first electrode, an organic layer having a light emitting layer made of an organic light emitting material provided therein and a second electrode are successively laminated. In the organic EL device, it is attempted to control light emitted in the light emitting layer through an enhancement of color purity of luminous color or an increase of luminous efficiency or the like by introducing a resonator structure, namely, by contriving to optimize a thickness of each of layers constituting the organic layer (see, for example, WO 01/39554).

Here, there may be the case where a problem is caused in viewing angle dependency of chromaticity or luminance, namely, there may be the case where a problem that as a viewing angle becomes large, a peak wavelength in a spectrum of light from an organic EL display apparatus largely moves, or light intensity is greatly lowered is caused; and therefore, it is desirable that the intensity of resonance is suppressed to a lower level as far as possible, namely, the thickness of the organic layer is made thin as far as possible (see, for example, the above-cited WO 01/39554). However, in the case where the thickness of the organic layer is thin, as schematically shown in FIG. 14, when a particle (foreign matter) or a protruding part is present on the first electrode, coverage of the organic layer does not become complete so that there is a concern that a short circuit is caused between the first electrode and the second electrode. Then, when such a short circuit is caused, in an organic EL display apparatus of an active matrix system, a pixel including the short circuit becomes a defect, thereby deteriorating the display quality of the organic EL display apparatus. Also, in an organic EL display apparatus of a passive matrix system, such a pixel including the short circuit becomes a missing line, thereby deteriorating the display quality of the organic EL display apparatus, too. Such a problem becomes a remarkable problem especially in a large-sized organic EL display apparatus. That is, this is because the viewing angle characteristic becomes severer, whereby a tolerable number of defects per unit area becomes small.

Up to date, grappling with decreasing the short circuit between the first electrode and the second electrode has been made in all sorts of ways. For example, JP-A-2001-035667 discloses a technology in which in an organic EL display apparatus of a bottom emission system, a highly resistive layer is inserted between an anode electrode and an organic film. Also, JP-A-2006-338916 discloses a technology in which in an organic EL display apparatus of a top emission system, an anode electrode is divided into two layers, and the layer constituting the anode electrode close to an organic layer is made highly resistive. Furthermore, JP-A-2005-209647 discloses a technology in which in an organic EL display apparatus of a bottom emission system, a cathode electrode is divided into two layers, and the layer constituting the cathode electrode close to an organic layer is made highly resistive.

SUMMARY

However, as disclosed in those patent documents, even in the case where a highly resistive layer is inserted between the anode electrode and the cathode electrode, when combined with a resonator structure, it may be impossible to solve the foregoing problems. That is, in order to enhance coverage of the highly resistive layer on the particle (foreign matter) or protruding part for the purpose of surely preventing a display defect from occurring, it is necessary to make a film thickness of the highly resistive layer sufficiently thick. However, when the film thickness of the highly resistive layer is made thick, as described previously, the viewing angle dependency is increased.

Also, an issue of lowering a drive voltage of the organic EL device is very important in reducing a consumed electrical power of the whole of the organic EL display apparatus.

In consequence, it is desirable to provide a light emitting device having a constitution or structure in which even when a particle (foreign matter) or a protruding part is present on the first electrode, a short circuit is not caused between the first electrode and the second electrode, and it is possible to contrive to lower the drive voltage.

A light emitting device according to a first embodiment of the present invention includes (A) a first electrode, (B) a conductor film, (C) an organic layer having a light emitting layer made of an organic light emitting material provided therein, (D) a semi-transmissive reflective film, (E) a resistive layer, and (F) a second electrode, all of which are laminated successively, wherein the conductor film transmits a part of light from the light emitting layer therethrough, the first electrode reflects the light having been transmitted through the conductor film, the second electrode transmits the light having been transmitted through the semi-transmissive reflective film therethrough, an average film thickness of the conductor film on the first electrode is from 1 nm to 6 nm, and an average film thickness of the semi-transmissive reflective film on the organic layer is from 1 nm to 6 nm.

A light emitting device according to a second embodiment of the present invention includes (A) a first electrode, (B) an organic layer having a light emitting layer made of an organic light emitting material provided therein, (C) a semi-transmissive reflective film, (D) a resistive layer, and (E) a second electrode, all of which are laminated successively, wherein the organic layer has a structure in which an electron transport layer, a light emitting layer, a hole transport layer and a hole injection layer are laminated from the side of the first electrode, the first electrode reflects light from the light emitting layer, the second electrode transmits the light having been transmitted through the semi-transmissive reflective film therethrough, and an average film thickness of the semi-transmissive reflective film on the organic layer is from 1 nm to 6 nm.

In the light emitting device according to the first embodiment of the present invention, since the conductor film is formed between the first electrode and the organic layer, it is possible to contrive to reduce electrical resistance of from the organic layer to the first electrode. As a result, it is possible to contrive to lower the drive voltage. Also, in the light emitting device according to the second embodiment of the present invention, the organic layer has a structure in which the electron transport layer, the light emitting layer, the hole transport layer and the hole injection layer are laminated from the side of the first electrode, and electron injection properties into the light emitting layer are enhanced. As a result, it is possible to contrive to lower the drive voltage. In view of the fact that the drive voltage can be lowered, an electric field intensity applied between the first electrode and the second electrode can be reduced, a dark spot to be caused due to leakage can be decreased, and it is possible to contrive to greatly decrease the consumed electrical power.

Moreover, in the light emitting device according to the first embodiment or second embodiment of the present invention, since the organic layer is interposed between the first electrode and the semi-transmissive reflective film and has a resonator structure, it is possible to contrive to enhance color purity of luminescent color and to enhance luminous efficiency. The resistive layer is formed above the organic layer, and the second electrode is formed on the resistive layer. Here, an average film thickness of the semi-transmissive reflective film on the organic layer is from 1 nm to 6 nm. In general, there is a possibility that such an extremely thin semi-transmissive reflective film becomes in a discontinuous state at least partially. In consequence, even when a foreign matter (particle) or a protruding part is present or a difference in level is present on the first electrode so that coverage of the organic layer is not complete, a voltage can be surely impressed to the organic layer from the second electrode. Moreover, in view of the fact that the resistive layer is present, not only a short circuit is not caused between the first electrode and the second electrode, but the first electrode and the semi-transmissive reflective film do not come into contact with each other.

Also, in the light emitting device according to the first embodiment or second embodiment of the present invention, with respect to characteristics of the light emitting device, the semi-transmissive reflective film is constituted of, for example, Mg—Ag which is used in related-art organic EL devices, etc., and the second electrode is provided separately from the semi-transmissive reflective film; and therefore, reliability not different from that in related-art light emitting devices or organic EL devices can be obtained.

Additional features and advantages are described herein, and will be apparent from the following Detailed Description and the figures.

BRIEF DESCRIPTION OF THE FIGURES

FIGS. 2A and 2B are schematic views of a light emitting device of Example 1.

DETAILED DESCRIPTION

Figure 1:
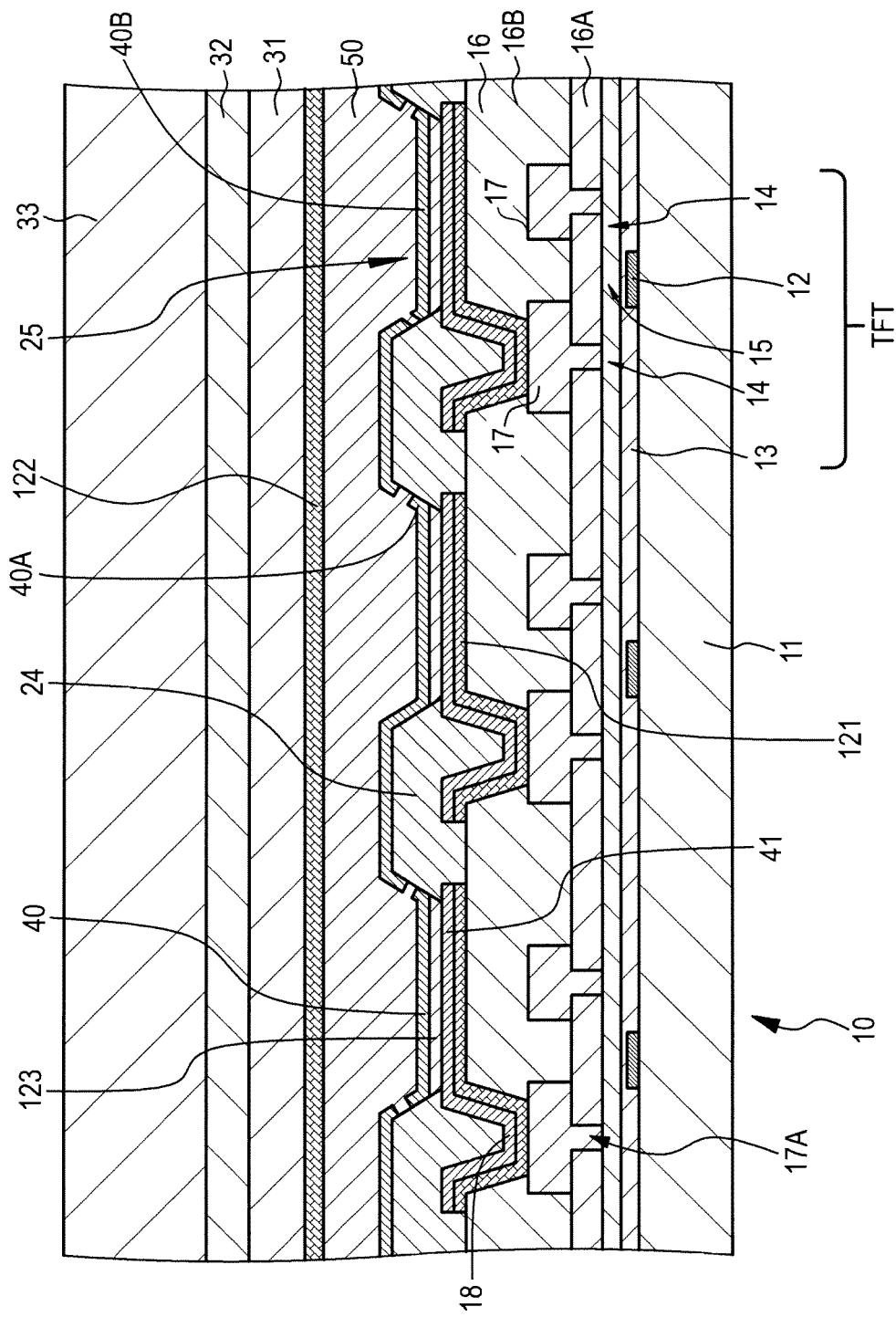
FIG. 1 is a schematic partial sectional view of an organic electroluminescence display apparatus in Example 1.

Embodiments of the present application will be described below in detail with reference to the drawings.

1. Description regarding light emitting devices according to the first embodiment and second embodiment of the present invention and the whole 2. Example 1 (light emitting device according to the first embodiment of the present invention)

3. Example 2 (modification of Example 1)

4. Example 3 (another modification of Example 1)

5. Example 4 (still another modification of Example 1)

6. Example 5 (light emitting device according to the second embodiment and others)

[Description Regarding Light Emitting Devices According to the First Embodiment and Second Embodiment of the Present Invention and the Whole]

In the light emitting device according to the first embodiment of the present invention, the conductor film can be constituted so as to include an alkali metal or an alkaline earth metal and silver (Ag) [for example, magnesium (Mg) and silver (Ag)] or include magnesium (Mg) and calcium (Ca) [for example, Mg—Ag or Mg—Ca], or the conductor film can be constituted of aluminum (Al) or silver (Ag). Also, in the light emitting device according to the first embodiment of the present invention or the light emitting device according to the second embodiment of the present invention, each of which includes such a constitution, the semi-transmissive reflective film can be constituted so as to include an alkali metal or an alkaline earth metal and silver (Ag) [for example, magnesium (Mg) and silver (Ag)] or include magnesium (Mg) and calcium (Ca) [for example, Mg—Ag or Mg—Ca], or the semi-transmissive reflective film can be constituted of aluminum (Al) or silver (Ag). In the case where the conductor film or the semi-transmissive reflective film is constituted of magnesium and silver, a volume ratio between magnesium and silver can be, for example, from 5/1 to 30/1 in terms of Mg/Ag. On the other hand, in the case where the conductor film or the semi-transmissive reflective film is constituted of magnesium and calcium, a volume ratio between magnesium and calcium can be, for example, from 2/1 to 10/1 in terms of Mg/Ca. In an organic EL display apparatus, the semi-transmissive reflective film is usually discriminated as a "film". However, as the case may be, the semi-transmissive reflective film is in a state in which an uppermost layer part of the organic layer, the semi-transmissive reflective film and a lower layer part of the resistive layer are mixed together; or in a state in which an uppermost layer part of the organic layer, magnesium constituting the semi-transmissive reflective film and the resistive layer are mixed together and silver particles are interspersed.

Also, in the light emitting device according to the first embodiment of the present invention including the foregoing preferred constitution, the organic layer can be formed in a mode having a structure in which a hole injection layer, a hole transport layer, a light emitting layer and an electron transport layer are laminated from the side of the first electrode, but it should not be construed that the organic layer is limited thereto.

Furthermore, the portion of the organic layer coming into contact with the conductor film in the light emitting device according to the first embodiment including the foregoing preferred constitution and mode, or the portion of the organic layer coming into contact with the semi-transmissive reflective film in the light emitting device according to the second embodiment including the foregoing preferred constitution and mode can be formed in a mode including a pyrazine derivative represented by the following formula (A).

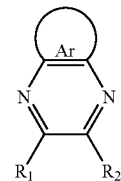

(A)

Alternatively, the portion of the organic layer coming into contact with the conductor film in the light emitting device according to the first embodiment including the foregoing preferred constitution and mode, or the portion of the organic layer coming into contact with the semi-transmissive reflective film in the light emitting device according to the second embodiment including the foregoing preferred constitution and mode can be formed in a mode including a hexaazatriphenylene derivative represented by the following formula (B), and more specifically a hexaazatriphenylene derivative represented by the following formula (C).

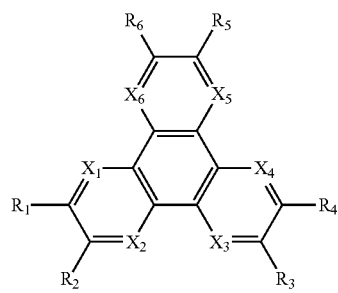

(B)

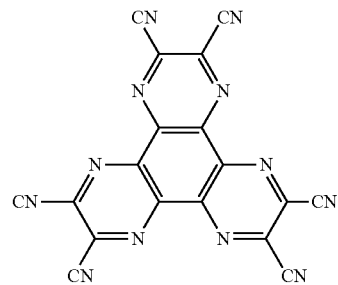

(C)

In the formula (A), Ar represents an aryl group; and in the formula (B), each of $X_1$ to $X_6$ independently represents a hydrogen atom or a nitrogen atom. Furthermore, each of $R_1$ and $R_2$ in the formula (A) or each of $R_1$ to $R_6$ in the formula (B) independently represents a substituent selected from the group consisting of hydrogen, a halogen, a hydroxyl group, an amino group, an arylamino group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a substituted or unsubstituted aryl group having not more than 30 carbon atoms, a substituted or unsubstituted heterocyclic group having not more than 30 carbon atoms, a nitrile group, a cyano group, a nitro group and a silyl group.

Also, in the light emitting device according to the second embodiment of the present invention including the foregoing preferred constitution and mode, the conductor film is provided between the first electrode and the organic layer, and the conductor film on the first electrode can be constituted so as to have an average film thickness of from 1 nm to 6 nm. The conductor film may be constituted of the foregoing material.

Furthermore, in the light emitting device according to the first embodiment or second embodiment of the present invention including the foregoing preferred constitution and mode, an electrical resistivity of the material constituting the resistive layer can be made in a mode of from $1\times10^6$ $\Omega\cdot m$ to $1\times10^{10}$ $\Omega\cdot m$ (from $1\times10^4$ $\Omega\cdot cm$ to $1\times10^8$ $\Omega\cdot cm$), and preferably $1\times10^8$ $\Omega\cdot m$ to $1\times10^9$ $\Omega\cdot m$ (from $1\times10^6$ $\Omega\cdot cm$ to $1\times10^7$ $\Omega\cdot cm$); and a thickness of the resistive layer above the organic layer can be made in a mode of from 0.1 μm to 2 μm, and preferably from 0.3 μm to 1 μmm. In that case, the resistive layer is desirably formed in a mode including an oxide semiconductor. Alternatively, the resistivity layer can be formed in a mode including niobium oxide ($Nb_2O_5$), titanium oxide ($TiO_2$), molybdenum oxide ($MoO_2$ or $MoO_3$), tantalum oxide ($Ta_2O_5$), hafnium oxide (HfO), IGZO, a mixture of niobium oxide and titanium oxide, a mixture of titanium oxide and zinc oxide (ZnO), a mixture of silicon oxide ($SiO_2$) and tin oxide ($SnO_2$) or an appropriate combination of those materials. More specifically, the electrical resistivity of the material constituting the resistive layer may be determined while taking into consideration a value of voltage drop to be caused in the resistive layer at the time of driving the light emitting device, and the value of voltage drop can be, for example, from 0.05 V to 1.0 V.

Alternatively, in the light emitting device according to the first embodiment or second embodiment of the present invention including the foregoing preferred constitution and mode, the resistive layer has a structure in which a first resistive layer and a second resistive layer are laminated from the side of the organic layer and can be formed in a mode in which an electrical resistivity of the second resistive layer is higher than an electrical resistivity of the first resistive layer. Alternatively, the resistivity layer has a structure in which a first resistive layer, a second resistive layer and a third resistive layer are laminated from the side of the organic layer and can be formed in a mode in which an electrical resistivity of the second resistive layer is higher than an electrical resistivity of the first resistive layer and also higher than an electrical resistivity of the third resistive layer. Here, as a material constituting the first resistive layer or the third resistive layer, a film made of zinc oxide, tin oxide, niobium oxide, titanium oxide, molybdenum oxide, tantalum oxide, a mixture of niobium oxide and titanium oxide, a mixture of titanium oxide and zinc oxide or a mixture of silicon oxide and tin oxide and prepared by film deposition upon reduction of an oxygen partial pressure at the time of film deposition can be exemplified; and as a material constituting the second resistive layer, niobium oxide, titanium oxide, molybdenum oxide, tantalum oxide, a mixture of niobium oxide and titanium oxide, a mixture of titanium oxide and zinc oxide or a mixture of silicon oxide and tin oxide can be exemplified. When the electrical resistivities of the first resistive layer, the second resistive layer and the third resistive layer are defined as $R_1$ ($\Omega\cdot m$), $R_2$ ($\Omega\cdot m$) and $R_3$ ($\Omega\cdot m$), respectively, it is desirable that the following relations are satisfied.

$1\times10^{-3} \le R_1/R_2 \le 1\times10^{-1}$ $1\times10^{-3} \le R_3/R_2 \le 1\times10^{-1}$ By forming the resistive layer in a multilayered structure, the contact state between the resistive layer and the semi-transmissive reflective film can be made much more favorable, the voltage drop in the resistive layer can be minimized, and it is possible to contrive to make the drive voltage low.

Alternatively, in the light emitting device according to the first embodiment or second embodiment of the present invention including the foregoing preferred constitution and mode, in the case where the resistivity layer has a laminated structure of at least the first resistive layer and the second resistive layer, when a refractive index of the material constituting the first resistive layer is defined as $n_1$, a refractive index of the material constituting the second resistive layer is defined as $n_2$, and furthermore, a refractive index of the material constituting the uppermost layer of the organic layer is defined as $n_0$, so far as importance is attached to the efficiency, it is desirable that the following relations are satisfied.

$-0.6 \le (n_0-n_1) \le -0.4$ $0.4 \le (n_1-n_2) \le 0.9$

Alternatively, so far as importance is attached to the viewing angle, it is desirable that the following relations are satisfied.

$-0.2 \le (n_0-n_1) \le 0.2$ $0.2 \le (n_1-n_2) \le 0.4$

Here, an interface between the first electrode and the organic layer in the case where the conductor film is not formed, or an interface between the first electrode and the conductor film in the case where the conductor film is formed is called a "first interface"; an interface between the semi-transmissive reflective layer and the organic layer is called a "second interface; an interface between the semi-transmissive reflective layer and the resistive layer is called a "third interface"; and an interface between the first resistive layer and the second resistive layer is called a "fourth interface". In general, though light emitted in the light emitting layer is resonated between the first interface and the second interface, when the thickness of the semi-transmissive reflective film becomes thin, there may be the case where a value of average light transmittance of the semi-transmissive reflective film becomes high so that the majority of light emitted in the light emitting layer is transmitted through the semi-transmissive reflective film. In such case, light emitted in the light emitting layer is resonated between the first interface and the third interface; alternatively, in the case where the resistive layer is of a multilayered constitution, light emitted in the light emitting layer is resonated between the first interface and the fourth interface; or alternatively, light emitted in the light emitting layer is resonated between the first interface and the third interface and between the first interface and the fourth interface. Though resonance of light emitted in the light emitting layer is also caused between an interface ("fifth interface") constituted of an interface between the conductor film and the organic layer and the second interface, reflection of light in the first electrode accounts for a considerable proportion on the side of the first electrode, and hence, in the following discussion, the resonance of light between the fifth interface and the second interface is included in the resonance of light between the first interface and the second interface.

Furthermore, in the light emitting device according to the first embodiment or second embodiment of the present invention including the foregoing preferred constitution and mode, it is possible to provide a constitution in which light emitted in the light emitting layer is resonated between the first interface and the second interface (or the foregoing third interface or fourth interface), and a part of the light is then outputted from the second electrode. In that case, when an optical distance from the first interface to a maximum light emitting position of the light emitting layer is defined as $OL_1$, and an optical distance from the second interface (or the third interface or fourth interface) to a maximum light emitting position of the light emitting layer is defined as $OL_2$, it is possible to form a mode satisfying the following expressions (1-1) and (1-2). Alternatively, in that case, when an optical distance between the first interface and the second interface (or the third interface or fourth interface) is defined as OL, a sum of phase shifts generated when light emitted in the light emitting layer is reflected at the first interface and the second interface (or the third interface or fourth interface) is defined as a $\Phi$ radian [wherein $-2n<\Phi\leq0$], and a maximum peak wavelength of a spectrum of light emitted in the light emitting layer is defined as $\lambda$, it is possible to form a mode satisfying either one of the following relations.

$$0.7\leq\{(2\times OL)/\lambda+\Phi/(2n)\}\leq1.3$$

$$-0.3\leq\{(2\times OL)/\lambda+\Phi/(2n)\}\leq0.3$$

In such a way, by specifying an interference condition or a resonance condition of light constituted by the organic layer, the first electrode and the semi-transmissive reflective film of the light emitting device, the viewing angle dependency of chromaticity or luminance can be extremely minimized.

$$0.7\{-\Phi_1/(2n)+m_1\}\leq(2\times OL_1)/\lambda\leq1.2\{-\Phi_1/(2n)+m_1\} \quad (1\text{-}1)$$

$$0.7\{-\Phi_2/(2n)+m_2\}\leq(2\times OL_2)/\lambda\leq1.2\{-\Phi_2/(2n)+m_2\} \quad (1\text{-}2)$$

In the foregoing expressions (1-1) and (1-2), $\lambda$ represents a maximum peak wavelength of a spectrum of light emitted in the light emitting layer;

$\Phi_1$ represents a phase shift amount (unit: radian) of reflected light generated at the first interface [wherein $-2n<\Phi_1\leq0$];

$\Phi_2$ represents a phase shift amount (unit: radian) of reflected light generated at the second interface (or the third interface or fourth interface) [wherein $-2n<\Phi_2\leq0$]; and the $(m_1, m_2)$ value is (0, 0), (1, 0) or (0, 1).

In the light emitting device according to the first embodiment or second embodiment of the present invention including the foregoing preferred constitution and mode (hereinafter sometimes generally named simply "light emitting device according to the present invention"), it is possible to form a mode in which light emitted in the light emitting layer is resonated between the first interface and the second interface (or the third interface or fourth interface), and a part of the light is then outputted from the semi-transmissive reflective film;

a maximum peak wavelength of a spectrum of light emitted in the light emitting layer is from 600 nm to 650 nm; and a film thickness of the organic layer on the first electrode is from $1.1\times10^{-7}$ m to $1.6\times10^{-7}$ m (light emitting device of red light emission constituting red light emission sub-pixels emitting a red color; referred to as "red light emitting device" or "red light emitting organic EL device").

Alternatively, in the light emitting device according to the present invention, it is possible to form a mode in which light emitted in the light emitting layer is resonated between the first interface and the second interface (or the third interface or fourth interface), and a part of the light is then outputted from the semi-transmissive reflective film;

a maximum peak wavelength of a spectrum of light emitted in the light emitting layer is from 500 nm to 550 nm; and a film thickness of the organic layer on the first electrode is from $9\times10^{-8}$ m to $1.3\times10^{-7}$ m (light emitting device of green light emission constituting green light emission sub-pixels emitting a green color; referred to as "green light emitting device" or "green light emitting organic EL device").

Alternatively, in the light emitting device according to the present invention, it is possible to form a mode in which light emitted in the light emitting layer is resonated between the first interface and the second interface (or the third interface or fourth interface), and a part of the light is then outputted from the semi-transmissive reflective film;

a maximum peak wavelength of a spectrum of light emitted in the light emitting layer is from 430 nm to 480 nm; and a film thickness of the organic layer on the first electrode is from $6\times10^{-8}$ m to $1.1\times10^{-7}$ m (light emitting device of blue light emission constituting blue light emission sub-pixels emitting a blue color; referred to as "blue light emitting device" or "blue light emitting organic EL device").

An organic electroluminescence display apparatus (organic EL display apparatus) to which the light emitting device according to the first embodiment of the present invention including the foregoing preferred constitution and mode is applied has a plurality of the light emitting devices (organic electroluminescence devices or organic EL devices) according to the first embodiment of the present invention including (a) a first electrode, (b) an insulating layer having an opening, in which the first electrode is exposed on a bottom of the opening, (c) an organic layer which is provided extending from an upper part of a portion of the first electrode exposed on the bottom of the opening to a portion of the insulating layer surrounding the opening and which is provided with a light emitting layer made of an organic light emitting material, (d) a semi-transmissive reflective film formed at least on the organic layer, (e) a resistive layer covering the semi-transmissive reflective film, and (f) a second electrode formed on the resistive layer, all of which are laminated successively, wherein the light emitting device is further provided with a conductor film formed between the first electrode and the organic layer, the conductor film transmits a part of light from the light emitting layer therethrough, the first electrode reflects the light having been transmitted through the conductor film, the second electrode transmits light having been transmitted through the semi-transmissive reflective film therethrough, an average film thickness of the conductor film on the first electrode is from 1 nm to 6 nm, an average film thickness of the semi-transmissive reflective film on the organic layer is from 1 nm to 6 nm, and a portion of the semi-transmissive reflective film on the insulating layer is at least partially discontinuous.

Also, an organic electroluminescence display apparatus (organic EL display apparatus) to which the light emitting device according to the second embodiment of the present invention including the foregoing preferred constitution and mode is applied has a plurality of the light emitting devices (organic electroluminescence devices or organic EL devices) according to the second embodiment of the present invention including (a) a first electrode, (b) an insulating layer having an opening, in which the first electrode is exposed on a bottom of the opening, (c) an organic layer which is provided extending from an upper part of a portion of the first electrode exposed on the bottom of the opening to a portion of the insulating layer surrounding the opening and which is provided with a light emitting layer made of an organic light emitting material, (d) a semi-transmissive reflective film formed at least on the organic layer, (e) a resistive layer covering the semi-transmissive reflective film, and (f) a second electrode formed on the resistive layer, all of which are laminated successively, wherein the organic layer has a structure in which an electron transport layer, a light emitting layer, a hole transport layer and a hole injection layer are laminated from the side of the first electrode, the first electrode reflects light from the light emitting layer, the second electrode transmits light having been transmitted through the semi-transmissive reflective film therethrough, an average film thickness of the semi-transmissive reflective film on the organic layer is from 1 nm to 6 nm, and a portion of the semi-transmissive reflective film on the insulating layer is at least partially discontinuous.

In the organic EL display apparatuses, the plural organic EL devices can be arranged in a form of stripe arrangement, diagonal arrangement, delta arrangement or rectangle arrangement.

Here, in the organic EL display apparatuses, the portion of the semi-transmissive reflective film on the insulating layer is at least partially discontinuous. More specifically, the portion of the semi-transmissive reflective film on the insulating layer may be partially linked to the portion of the semi-transmissive reflective film on the organic layer, or it may not be connected thereto. Also, there may be formed a mode in which in a part of the organic EL devices, the portion of the semi-transmissive reflective film on the insulating layer is partially linked to the portion of the semi-transmissive reflective film on the organic layer, whereas in the remaining organic EL devices, the portion of the semi-transmissive reflective film on the insulating layer is not connected to the portion of the semi-transmissive reflective film on the organic layer.

In the embodiments according to the present invention including the foregoing various preferred constitutions and modes, in the case where a foreign matter or a protruding part is present on the first electrode, there can be formed a constitution in which the semi-transmissive reflective film is not formed in a neighborhood of the foreign matter or protruding part, and the resistive layer is present between the portion of the semi-transmissive reflective film located in the surroundings of the foreign matter or protruding part and the portion of the first electrode located beneath the foreign matter or in a root of the protruding part. Here, there is a high possibility that the foreign matter (particle) often attaches onto the first electrode at the time of forming the first electrode or the like or at the time of conveyance. On the other hand, the protruding part is often produced at the time of forming the first electrode or the like.

In the embodiments according to the present invention including the foregoing preferred constitutions and modes, it is desirable that an average light reflectance of the first electrode is 50% or more, and preferably 80% or more; and that an average light transmittance of the semi-transmissive reflective film or conductor film is from 50% to 97%, and preferably from 60% to 97%.

As a material (light reflective material) constituting the first electrode (light reflective electrode) in the light emitting device according to the first embodiment of the present invention, in the case where the first electrode is made to function as an anode electrode, examples thereof include metals (for example, platinum (Pt), gold (Au), silver (Ag), chromium (Cr), tungsten (W), nickel (Ni), copper (Cu), iron (Fe), cobalt (Co) and tantalum (Ta)) or alloys (for example, an Ag—Pd—Cu alloy composed mainly of silver and containing from 0.3% by weight to 1% by weight of palladium (Pd) and from 0.3% by weight to 1% by weight of copper (Cu) and an Al—Nd alloy) each having a high work function. Furthermore, in the case of using a conductive material having a small work function value and a high light reflectance, such as aluminum (Al) and alloys containing aluminum, it can be used as the anode electrode by, for example, providing an appropriate hole injection layer to enhance hole injection properties. A thickness of the first electrode is, for example, from 0.1 µm to 1 µm. Alternatively, there can also be formed a structure in which a transparent conductive material with an excellent hole injection characteristic, such as an oxide of indium and tin (ITO) and an oxide of indium and zinc (IZO), is laminated on a dielectric multilayered film or a light reflective film with high light reflection, such as aluminum (Al). On the other hand, in the case where the first electrode is made to function as a cathode electrode, it is desirable that the first electrode is constituted of a conductive material having a small work function value and having a high light reflectance. However, a material obtained by, for example, providing an appropriate electron injection layer on a conductive material with a high light reflectance which is used as an anode electrode, thereby enhancing electron injection properties can also be used as the cathode electrode. In the light emitting device according to the second embodiment of the present invention, since the first electrode is made to function as a cathode electrode, as described previously, it is desirable that the first electrode is constituted of a conductive material having a small work function value and having a high light reflectance. However, when the conductor film is formed between the first electrode and the organic layer, a conductive material with a high light reflectance which is used as the foregoing anode electrode can also be used as the cathode electrode.

On the other hand, in the case where the second electrode is made to function as a cathode electrode, it is desirable that a material (semi light transmissive material) constituting the second electrode according to the present invention is constituted of a conductive material having a small work function value such that the material can transmit emitted light therethrough and an electron can be efficiently injected into the organic layer. Examples thereof include metals or alloys such as a magnesium-silver alloy, aluminum, silver, calcium and strontium. Also, there may be formed a constitution in which an appropriate electron injection layer is provided on a so-called transparent electrode material made of ITO or IZO. A thickness of the second electrode is, for example, from $2\times10^{-9}$ m to $5\times10^{-8}$ m, preferably from $3\times10^{-9}$ m to $2\times10^{-8}$ m, and more preferably from $5\times10^{-9}$ m to $1\times10^{-8}$ m. Also, a bus electrode (auxiliary electrode) made of a low resistive material may be provided for the second electrode, thereby contriving to realize low resistance as a whole of the second electrode. In the case where the second electrode is made to function as an anode electrode, it is desirable that the second electrode is constituted of a conductive material capable of transmitting emitted light therethrough and having a large work function value.

Examples of a method for forming the first electrode, the second electrode, the conductor film or the semi-transmissive reflective film include a vapor deposition method inclusive of an electron beam vapor deposition method, a hot filament vapor deposition method and a vacuum vapor deposition method, a sputtering method, a chemical vapor deposition method (CVD method) and a combination of an ion plating method and an etching method; various printing methods such as a screen printing method, an inkjet printing method and a metal mask printing method; a plating method (for example, an electric plating method and an electroless plating method); a liftoff method; a laser abrasion method; and a sol-gel method. According to various printing methods and plating methods, it is possible to directly form the first electrode, the second electrode, the conductor film or the semi-transmissive reflective film having a desired shape (pattern). In the case where after forming the organic layer, the first electrode or second electrode is formed, from the viewpoint of preventing the occurrence of damage of the organic layer, it is preferable to form the first electrode or second electrode on the basis of a film deposition method with especially small energy of film-deposited particles, such as a vacuum vapor deposition method, or a film deposition method such as an MOCVD method. Also, in the case of forming the semi-transmissive reflective film, from the viewpoints of preventing the occurrence of damage of the organic layer and providing a discontinuous portion, it is preferable to form the semi-transmissive reflective film on the basis of a film deposition method with poor coverage as well as especially small energy of film-deposited particles, such as a vacuum vapor deposition method. When damage occurs in the organic layer, there is a concern that a non-light emitting pixel (or a non-light emitting sub-pixel) due to the generation of leakage current, which is called a "dark spot", is produced. From the viewpoint of preventing deterioration of the organic layer to be caused due to moisture in the air, it is preferable to carry out the process including from the formation of the organic layer to the formation of the electrode or the like without being exposed to the air. The second electrode and the semi-transmissive reflective film may be or may not be electrically connected to each other.

It is preferable that each of the resistive layer, the first resistive layer, the second resistive layer and the third resistive layer is fowled by a film deposition method with good coverage, for example, a sputtering method, a CVD method, an ion plating method, etc.

The first electrode and the semi-transmissive reflective film absorb a part of incident light and reflect the remaining light. In consequence, phase shifts are generated in the reflected light. Those phase shift amounts $\Phi_1$ and $\Phi_2$ can be determined by, for example, measuring values of a real part and an imaginary part of a complex refractive index of a material constituting each of the first electrode and the semi-transmissive reflective film by an ellipsometer and performing calculation on the basis of those values (see, for example, Principles of Optic, Max Born and Emil Wolf, 1974 (PERGAMON PRESS). Refractive indexes of the organic layer, the second electrode, the conductor film and other layers can also be measured using an ellipsometer.

The organic layer is provided with a light emitting layer made of an organic light emitting material. Specifically, in addition to the foregoing constitutions, the organic layer can be constituted of, for example, a laminated structure of a hole transport layer, a light emitting layer and an electron transport layer; a laminated structure of a hole transport layer and a light emitting layer also functioning as an electron transport layer; or a laminated structure of a hole injection layer, a hole transport layer, a light emitting layer, an electron transport layer and an electron injection layer. Also, in the light emitting device according to the second embodiment of the present invention, in the case where an electron transport layer, a light emitting layer, a hole transport layer and a hole injection layer are formed as a "tandem unit", the organic layer may have a two-stage tandem structure in which a first tandem unit, a connection layer and a second tandem unit are laminated, and furthermore, the organic layer may have a three-stage or multi-stage tandem structure in which three or more tandem units are laminated. In those cases, the organic layer which emits a white color as a whole can be obtained by changing the luminescent color red, green and blue, respectively by each of the tandem units. Examples of a method for forming the organic layer include a physical vapor deposition method (PVD method) such as a vacuum vapor deposition method; a printing method such as a screen printing method and an inkjet printing method; a laser transfer method in which a laser is irradiated on a laminated structure of a laser absorbing layer formed on a transfer substrate and an organic layer, thereby separating the organic layer on the laser absorbing layer, and the organic layer is transferred; and various coating methods. In the case of forming the organic layer on the basis of a vacuum vapor deposition method, the organic layer can be obtained by, for example, using a so-called metal mask and depositing a material having passed through an aperture provided in the metal mask.

Here, according to the present invention, it is desirable that a thickness of the hole transport layer (hole supply layer) and a thickness of the electron transport layer (electron supply layer) are generally equal to each other. Alternatively, the electron transport layer (electron supply layer) may be made thicker than the hole transport layer (hole supply layer). In that case, it becomes possible to achieve electron supply necessary and sufficient for realization of high efficiency into the light emitting layer at a low drive voltage. That is, in the light emitting device according to the present invention, by disposing the hole transport layer between the electrode corresponding to the anode electrode and the light emitting layer and forming it in a film thickness thinner than the electron transport layer, it becomes possible to increase the supply of a hole. According to this, since a carrier balance in which not only the hole and the electron are neither too much nor too little, but the supply amount of a carrier is sufficiently large, high luminous efficiency can be obtained. Also, in view of the fact that the hole and the electron are neither too much nor too little, the carrier balance hardly breaks down, drive deterioration is suppressed, and a light emitting life can be prolonged.

According to the present invention, the plural light emitting devices are formed on a first substrate or above the first substrate. Here, examples of the first substrate or second substrate include a high-strain point glass substrate, a soda glass ($Na_2O.CaO.SiO_2$) substrate, a borosilicate glass ($Na_2O.B_2O_3.SiO_2$) substrate, a forsterite ($2MgaO.SiO_2$) substrate, a lead glass ($Na_2O.PbO.SiO_2$) substrate, a glass substrate of every kind having an insulating film formed on the surface thereof, a quartz substrate, a quartz substrate having an insulating film formed on the surface thereof, a silicon substrate having an insulating film formed on the surface thereof and an organic polymer exemplified by polymethyl methacrylate (PMMA), polyvinyl alcohol (PVA), polyvinylphenol (PVP), polyethersulfone (PES), polyimides, polycarbonates and polyethylene terephthalate (PET) (having a mode of a polymer material such as flexible plastic films, plastic sheets and plastic substrates, each of which is constituted of a polymer material). However, in an organic EL display apparatus of a bottom light emitting type as described later, the first substrate is required to be transparent to light to be outputted by the light emitting device. The materials substituting the first substrate and the second substrate may be the same as or different from each other.

In the organic EL display apparatus, the first electrode is, for example, provided on an interlayer insulating layer. This interlayer insulating layer covers a light emitting device driving part formed on the first substrate. The light emitting device driving part is constituted of one or plural thin-film transistors (TFTs), and TFT and the first electrode are electrically connected to each other via a contact plug provided in the interlayer insulating layer. As a constituent material of the interlayer insulating layer, $SiO_2$ based materials such as $SiO_2$, BPSG, PSG, BSG, AsSG, PbSG, SiON, SOG (spin-on glass), a low-melting point glass and a glass paste; SiN based materials; insulating resins such as polyimides can be used singly or properly combined and used. For the formation of the interlayer insulating layer, a known process such as a CVD method, a coating method, a sputtering method and various printing methods can be utilized. In an organic EL display apparatus of a bottom light emitting type as described later, the interlayer insulating layer is required to be constituted of a material which is transparent to light from the light emitting device, and the light emitting device driving part is required to be formed such that it does not block the light from the light emitting device. On the other hand, it is preferable that the insulating layer provided on the interlayer insulating layer is constituted of an insulating material which is excellent in flatness and low in water absorption for the purposes of preventing deterioration of the organic layer to be caused due to moisture and keeping a light emission luminance, and specifically, polyimide resins can be exemplified. In the case where a bus electrode (auxiliary electrode) made of a low resistive material is provided relative to the second electrode, it is desirable to provide a bus electrode (auxiliary electrode) in a position such that a projective image of the bus electrode (auxiliary electrode) is included in the projective image of the insulating layer.

In the organic EL display apparatus, there can be formed a constitution in which the second substrate fixed above the second electrode is provided. There may be the case where the organic EL display apparatus of such a constitution is called an "organic EL display apparatus of a top light emitting type" for the sake of convenience. On the other hand, there can also be formed a constitution in which the first substrate fixed beneath the second electrode is provided. There may be the case where the organic EL display apparatus of such a constitution is called an "organic EL display apparatus of a bottom light emitting type" for the sake of convenience. In the organic EL display apparatus of a top light emitting type, there can be formed a mode in which a protective film and an adhesive layer (sealing layer) are formed from the side of the second electrode between the second electrode and the second substrate. Here, as a material constituting the protective film, it is preferable to use a material which is transparent to light emitted in the light emitting layer, is minute and does not allow moisture to permeate therethrough. Specific examples thereof include amorphous silicon (α-Si), amorphous silicon carbide (α-SiC), amorphous silicon nitride (α-$Si_{1-x}N_x$), amorphous silicon oxide (α-$Si_{1-y}O_y$), amorphous carbon (α-C), amorphous silicon oxynitride (α-SiON) and $Al_2O_3$. Examples of a material constituting the adhesive layer (sealing layer) include thermosetting adhesives such as an acrylic adhesive, an epoxy based adhesive, a urethane based adhesive, a silicone based adhesive and a cyanoacrylate based adhesive; and ultraviolet ray-curable adhesives. In the organic EL display apparatus of a bottom light emitting type, there can also be formed a mode in which the first substrate is disposed above the first electrode, and the foregoing protective film and adhesive layer are formed from the side of the first electrode between the first electrode and the second substrate.

For the purpose of preventing moisture from reaching the organic layer, as described previously, it is preferable to provide an insulating or conductive protective film above the organic layer. It is preferable to form the protective film on the basis of a film deposition method with especially small energy of film-deposited particles, such as a vacuum vapor deposition method, or a CVD method because influences against the underlayer can be minimized. Alternatively, in order to prevent a lowering of the luminance to be caused due to deterioration of the organic layer, it is desirable to set up the film deposition temperature at ordinary temperature and further to achieve film deposition of the protective film under such a condition that a stress of the protective film becomes minimum for the purpose of preventing separation of the protective film. Also, it is preferable that the formation of the protective film is performed without exposing the already formed electrode to the air. According to this, the deterioration of the organic layer to be caused due to moisture or oxygen in the air can be prevented. Furthermore, in the case where the organic EL display apparatus is of a top light emitting type, it is desirable that the protective film is constituted of a material capable of transmitting, for example, 80% or more of light emitted in the organic layer therethrough. Specifically, inorganic amorphous insulating materials, for example, the foregoing materials can be exemplified. Since such an inorganic amorphous insulating material does not produce grains, it is low in water permeability and constitutes a favorable protective film. In the case where the protective film is constituted of a conductive material, the protective film may be constituted of a transparent conductive material such as ITO and IZO.

When the organic EL display apparatus is designed as an organic EL display apparatus of color display, sub-pixels are constituted by each of the organic EL devices constituting the organic EL display apparatus. Here, a single pixel is, for example, constituted of three kinds of sub-pixels of a red light emitting sub-pixel for light emitting a red color (constituted of a red light emitting device), a green light emitting sub-pixel for light emitting a green color (constituted of a green light emitting device) and a blue light emitting sub-pixel for light emitting a blue color (constituted of a blue light emitting device). In consequence, in that case, when the number of organic EL devices constituting the organic EL display apparatus is defined as "N×M", the number of pixels is (N×M)/3. Alternatively, the organic EL display apparatus can be used as a lighting apparatus including a backlight unit for liquid crystal display apparatus and a planar light source apparatus.

If desired, a color filter or a light shielding film (black matrix) may be formed on the second substrate or first substrate through which light from the light emitting device passes.

As the case may be, an electrical resistance value $R_R$ of the resistive layer constituting the red light emitting device, an electrical resistance value $R_G$ of the resistive layer constituting the green light emitting device and an electrical resistance value $R_B$ of the resistive layer constituting the blue light emitting device may be made different from each other. That is, for example, the following relations may be satisfied.

$$R_B > R_G$$

$$R_B > R_R$$

In order to make $R_B$, $R_G$ and $R_R$ different from each other, for example, a thickness of the resistive layer constituting the red light emitting device, a thickness of the resistive layer constituting the green light emitting device and a thickness of the resistive layer constituting the blue light emitting device may be made different from each other. Alternatively, a constituent material of the resistive layer constituting the red light emitting device, a constituent material of the resistive layer constituting the green light emitting device and a constituent material of the resistive layer constituting the blue light emitting device may be made different from each other. Alternatively, a content of a material contributing to conductivity of the resistive layer constituting the red light emitting device, a content of a material contributing to conductivity of the resistive layer constituting the green light emitting device and a content of a material contributing to conductivity of the resistive layer constituting the blue light emitting device may be made different from each other.

Also, as the case may be, an extraction electrode for connecting the second electrode to an external circuit may be provided in an outer peripheral region of the organic EL display apparatus. The "outer peripheral region of the organic EL display apparatus" as referred to herein is a region in which a display region is surrounded in a picture frame shape. The "display region" as referred to herein is a region positioning substantially in the center where a practically useful image display function is accomplished as the organic EL display apparatus. The extraction electrode is provided on the first substrate or second substrate and may be constituted of a so-called high-melting point metal film, for example, a titanium (Ti) film, a molybdenum (Mo) film, a tungsten (W) film, a tantalum (Ta) film, etc. For the connection between the second electrode and the extraction electrode, for example, an extending part of the second electrode may be formed on the extraction electrode. As a method for forming the extraction electrode, the same methods as those described previously as the forming method of the first electrode or second electrode can be exemplified.

Example 1

Example 1 is concerned with the light emitting device according to the first embodiment of the present invention. A schematic partial sectional view of an organic EL display apparatus to which the light emitting device according to the first embodiment of the present invention is applied is shown in FIG. 1; and a schematic view of an organic layer and the like is shown in each of FIGS. 2A and 2B. The organic EL display apparatus in Example 1 is an organic EL display apparatus of color display of an active matrix type and is of a top light emitting type. That is, light is outputted through the second electrode and further through the second substrate.

The organic EL display apparatus in Example 1 has a plural number (for example, N×M=2,880×540) of light emitting devices (specifically, organic EL devices) 10. The single light emitting device (organic EL device) 10 constitutes a single sub-pixel. In consequence, the organic EL display apparatus has (N×M)/3 pixels. Here, a single pixel is constituted of three kinds of sub-pixels of a red light emitting sub-pixel for light emitting a red color (constituted of a red light emitting device), a green light emitting sub-pixel for light emitting a green color (constituted of a green light emitting device) and a blue light emitting sub-pixel for light emitting a blue color (constituted of a blue light emitting device).

As shown in FIG. 1 and FIGS. 2A and 2B, the light emitting device (organic EL device) of Example 1 includes
(A) a first electrode 121,
(B) a conductor film 41,
(C) an organic layer 123 having a light emitting layer 123A made of an organic light emitting material provided therein,
(D) a semi-transmissive reflective film 40,
(E) a resistive layer 50, and
(F) a second electrode 122, all of which are laminated successively.

The conductor film 41 transmits a part of light from the light emitting layer 123A therethrough. Also, the first electrode 121 reflects the light having been transmitted through the conductor film 41. Furthermore, the second electrode 122 transmits light having been transmitted through the semi-transmissive reflective film 40 therethrough. Here, an average film thickness of the conductor film 41 on the first electrode 121 is from 1 nm to 6 nm, and an average film thickness of the semi-transmissive reflective film 40 on the organic layer 123 is from 1 nm to 6 nm.

Also, the organic EL display apparatus in Example 1 has a plurality of the light emitting devices (organic EL devices) of Example 1 including
(a) the first electrode 121,
(b) an insulating layer 24 having an opening 25, in which the first electrode 121 is exposed on a bottom of the opening 25,
(c) the organic layer 123 which is provided extending from an upper part of a portion of the first electrode 121 exposed on the bottom of the opening 25 to a portion of the insulating layer 24 surrounding the opening 25 and in which the light emitting layer 123A made of an organic light emitting material is provided,
(d) the semi-transmissive reflective film 40 formed at least on the organic layer 123,
(e) the resistive layer 50 covering the semi-transmissive reflective film 40, and
(f) the second electrode 122 formed on the resistive layer 50, all of which are laminated successively. The light emitting device is further provided with the conductor film 41 formed between the first electrode 121 and the organic layer 123.

Also, the conductor film 41 transmits a part of light from the light emitting layer 123A therethrough;
the first electrode 121 reflects the light having been transmitted through the conductor film 41;
the second electrode 122 transmits light having been transmitted through the semi-transmissive reflective film 40 therethrough;
an average film thickness of the conductor film 41 on the first electrode 121 is from 1 nm to 6 nm;
an average film thickness of the semi-transmissive reflective film 40 on the organic layer 123 is from 1 nm to 6 nm; and
a portion of the semi-transmissive reflective film 40 on the insulating layer 24 is at least partially discontinuous.

Here, in Example 1, the first electrode 121 is used as an anode electrode, and the second electrode 22 is used as a cathode electrode. Specifically, the first electrode 121 is made of a light reflective material such as an Al—Nd alloy having a thickness of 0.2 µm; the second electrode 122 is made of a transparent conductive material such as ITO or IZO having a thickness of 0.1 µm; and the semi-transmissive reflective film 40 is made of an alkali metal or an alkaline earth metal and silver (Ag), and more specifically Mg—Ag having a thickness of 5 nm. Also, the conductor film 41 is made of an alkali metal or an alkaline earth metal and silver (Ag), and more specifically Mg—Ag having a thickness of 2 nm. Here, a volume ratio of magnesium and silver (Mg/Ag) is 10/1. Also, the resistive layer 50 is made of niobium oxide ($Ng_2O_5$) having an electrical resistivity of $1×10^8$ Ω·m ($1×10^6$ Ω·cm), and a thickness of the resistive layer 50 above the organic layer 123 is 0.5 inn. The first electrode 121 and the conductor film 41, each having been subjected to patterning in a desired shape, are formed on the basis of a combination of a vacuum vapor deposition method and an etching method. On the other hand, the second electrode 122 and the semi-transmissive reflective film 40 are formed by a film deposition method with poor coverage as well as especially small energy of film-deposited particles, such as a vacuum vapor deposition method. The second electrode 122 and the semi-transmissive reflective film 40 are not subjected to patterning but formed in a single sheet shape. An electron injection layer (not illustrated) made of LiF having a thickness of 0.3 nm is formed between the organic layer 123 and the semi-transmissive reflective film 40. A measurement result of a refractive index of each of the first electrode 121 and the second electrode 122, a measurement result of a light reflectance of the first electrode 121 and a measurement result of a light transmittance of each of the semi-transmissive reflective film 40 and the conductor film 41 are shown in the following Table 2. The measurements were carried out at a wavelength of 530 nm.

In Example 1, the insulating layer 24 is constituted of an insulating material which is excellent in flatness and low in water absorption for the purposes of preventing deterioration of the organic layer 123 due to moisture and keeping a light emission luminance, specifically a polyimide resin. For example, the organic layer 123 has a structure in which a hole injection layer, a hole transport layer 123B, the light emitting layer 123A and an electron transport layer 123C are laminated from the side of the first electrode 121. In the drawings, there may be the case where a single layer is expressed, whereas there may be the case where the hole injection layer and the hole transport layer are expressed by a single layer of the hole transport layer.

Here, the portion of the organic layer 123 coming into contact with the conductor film 41, specifically the hole injection layer contains a pyrazine derivative represented by the following formula (A).

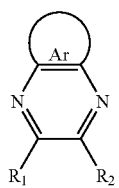

(A)

Alternatively, the portion of the organic layer 123 coming into contact with the conductor film 41, specially the hole injection layer contains a hexaazatriphenylene derivative represented by the following formula (B), and more specifically a hexaazatriphenylene derivative represented by the following formula (C).

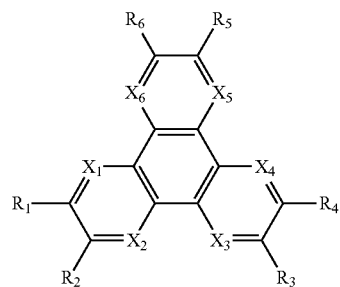

(B)

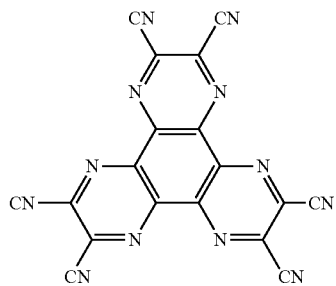

(C)

In the formula (A), Ar represents an aryl group; and in the formula (B), each of $X_1$ to $X_6$ independently represents a hydrogen atom or a nitrogen atom. Also, each of $R_1$ and $R_2$ in the formula (A) or each of $R_1$ to $R_6$ in the formula (B) independently represents a substituent selected from the group consisting of hydrogen, a halogen, a hydroxyl group, an amino group, an acylamino group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a substituted or unsubstituted aryl group having not more than 30 carbon atoms, a substituted or unsubstituted heterocyclic group having not more than 30 carbon atoms, a nitrile group, a cyano group, a nitro group and a silyl group.

In Example 1, the first electrode 121 constituting the organic EL device is provided on an interlayer insulating layer 16 (more specifically, an upper interlayer insulating layer 16B) made of $SiO_2$ formed on the basis of a CVD method. This interlayer insulating layer 16 covers an organic EL device driving part formed on a first substrate 11 made of a soda glass. The organic EL device driving part is constituted of plural TFTs. TFT and the first electrode 121 are electrically connected to each other via a contact plug 18, a wiring 17 and a contact plug 17A each provided in the interlayer insulating layer 16 (more specifically, the upper interlayer insulating layer 16B). In FIG. 1, a single TFT was illustrated in every single organic EL device driving part. TFT is constituted of a gate electrode 12 formed on the first substrate 11; a gate insulating film 13 formed on the first substrate 11 and the gate electrode 12; a source/drain region 14 provided in a semiconductor layer formed on the gate insulating film 13; and a channel forming region 15 located between the source/drain regions 14 and corresponding to a portion of the semiconductor layer located above the gate electrode 12. In the illustrated example, TFT is formed in a bottom gate type, but it may be of a top gate type. The gate electrode 12 of TFT is connected to a scanning circuit (not illustrated).

In Example 1, on the second electrode 122, for the purpose of preventing moisture from reaching the organic layer 123, an insulating protective film 31 made of amorphous silicon nitride ($Si_{1-x}N_x$) is provided on the basis of a plasma CVD method. A second substrate 33 made of a soda glass is disposed on the protective film 31, and the protective film 31 and the second substrate 33 are bonded to each other by an adhesive layer 32 made of an acrylic adhesive. A measurement result of a refractive index of each of the protective film 31 and the adhesive layer 32 is shown in the following Table 2. The refractive index is a measurement result at a wavelength of 530 nm.

When the foregoing is summarized, a detailed constitution of the light emitting device of Example 1 is shown in the following Table 1.

TABLE 1

| | |
|---|---|
| Second substrate 33: | Soda glass |
| Adhesive layer 32: | Acrylic adhesive |
| Protective film 31: | SiN$_x$ layer (thickness: 5 μm) |
| Second electrode (cathode electrode) 122: | ITO layer (thickness: 0.1 μm) |
| Resistive layer 50: | Nb$_2$O$_5$ layer (thickness: 0.5 μm) |
| Semi-transmissive reflective film 40: | Mg—Ag film (thickness: 5 nm) |
| Electron injection layer: | LiF layer (thickness: 0.3 nm) |
| Organic layer 123: | Described later |
| Conductor film 41: | Mg—Ag film (thickness: 2 nm) |
| First electrode (anode electrode) 121: | Al—Nd layer (thickness: 0.2 μm) |
| Interlayer insulating layer 16: | SiO$_2$ layer |
| TFT: | Constituting the organic EL device driving part |
| First substrate 11: | Soda glass |

TABLE 2

| Refractive index of the first electrode 121 | |
|---|---|
| Real part: | 0.755 |
| Imaginary part: | 5.466 |
| Refractive index of each of the semi-transmissive reflective film 40 and the conductor film 41 | |
| Real part: | 0.617 |
| Imaginary part: | 3.904 |
| Refractive index of the second electrode 122 | |
| Real part: | 1.814 |
| Imaginary part: | 0 |
| Refractive index of the resistive layer 50 | |
| Real part: | 2.285 |
| Imaginary part: | 0 |
| Refractive index of the protective film 31 | |
| Real part: | 1.87 |
| Imaginary part: | 0 |
| Refractive index of the adhesive layer 32 | |
| Real part: | 1.53 |
| Imaginary part: | 0 |
| Light reflectance of the first electrode 121: | 85% |
| Light transmittance of each of the semi-transmissive reflective film 40 and the conductor film 41: | 79% |
| Light reflectance of the second electrode 122: | 2% |

Though a portion 40A of the semi-transmissive reflective film 40 on the insulating layer 24 is at least partially discontinuous, the portion 40A of the semi-transmissive reflective film 40 on the insulating layer 24 is partially linked to a portion 40B of the semi-transmissive reflective film 40 on the organic layer 123. As the case may be, the portion 40A of the semi-transmissive reflective film 40 on the insulating layer 24 is not linked to the portion 40B of the semi-transmissive reflective film 40 on the organic layer 123. Alternatively, as the case may be, in a part of the organic EL devices, the portion 40A of the semi-transmissive reflective film 40 on the insulating layer 24 is linked to the portion 40B of the semi-transmissive reflective film 40 on the organic layer 123, and in the remaining organic EL devices, the portion 40A of the semi-transmissive reflective film 40 on the insulating layer 24 is not linked to the portion 40B of the semi-transmissive reflective film 40 on the organic layer 123. An average film thickness of the portion 40A of the semi-transmissive reflective film 40 on the insulating layer 24 is thinner than an average film thickness of the portion 40B of the semi-transmissive reflective film 40 on the organic layer 123. In consequence, by regulating the average film thickness of the portion 40B of the semi-transmissive reflective film 40 on the organic layer 123 to from 1 nm to 6 nm, the portion 40A of the semi-transmissive reflective film 40 on the insulating layer 24 can be surely made in a discontinuous state.

Then, the light emitted in the light emitting layer 123A is resonated between a first interface 26 constituted by an interface between the first electrode 121 and the conductor film 41 and a second interface 27 constituted by an interface between the semi-transmissive reflective film 40 and the organic layer 123, and a part of the light is then outputted from the semi-transmissive reflective film 40 and further the second electrode 122.

Also, in the light emitting device of Example 1, as shown in FIGS. 2A and 2B, when a distance from the first interface 26 to a maximum light emitting position of the light emitting layer 123A is defined as L$_1$ and its optical distance is defined as OL$_1$, and a distance from the second interface 27 to a maximum light emitting position of the light emitting layer 123A is defined as L$_2$ and its optical distance is defined as OL$_2$, the following expressions (1-1) and (1-2) are satisfied.

$$0.7\{-\Phi_1/(2n)+m_1\} \leq (2 \times OL_1)/\lambda \leq 1.2\{-\Phi_1/(2n)+m_1\} \quad (1\text{-}1)$$

$$0.7\{-\Phi_2/(2n)+m_2\} \leq (2 \times OL_2)/\lambda \leq 1.2\{-\Phi_2/(2n)+m_2\} \quad (1\text{-}2)$$

In the foregoing expressions (1-1) and (1-2),

λ represents a maximum peak wavelength of a spectrum of light emitted in the light emitting layer 123A;

$\Phi_1$ represents a phase shift amount (unit: radian) of reflected light generated at the first interface 26 [wherein $-2n < \Phi_1 \leq 0$];

$\Phi_2$ represents a phase shift amount (unit: radian) of reflected light generated at the second interface 27 [wherein $-2n < \Phi_2 \leq 0$]; and the (m$_1$, m$_2$) value is (0, 0) in Example 1 or Example 5 as described later.

Furthermore, in the light emitting device of Example 1, when an optical distance between the first interface 26 and the second interface 27 is defined as OL, a sum of phase shifts generated when light emitted in the light emitting layer 123A is reflected at the first interface 26 and the second interface 27 is defined as a Φ radian [wherein $-2n < \Phi \leq 0$], and a maximum peak wavelength of a spectrum of light emitted in the light emitting layer 123A is defined as λ, the following relation is satisfied.

$$-0.3 \leq \{(2 \times OL)/\lambda + \Phi/(2n)\} \leq 0.3$$

In Example 1, specifically, the respective organic layers 123 are constituted of a red light emitting organic layer constituting a red light emitting device, a green light emitting organic layer constituting a green light emitting device and a blue light emitting organic layer constituting a blue light emitting device. The plural organic EL devices can be arranged in a form of stripe arrangement, diagonal arrangement, delta arrangement or rectangle arrangement.

That is, the red light emitting device (red light emitting organic EL device) resonates light emitted in the light emitting layer 123A between the first interface 26 and the second interface 27, and a part of the light is then outputted from the semi-transmissive reflective film 40 and further the second electrode 122. A maximum peak wavelength of a spectrum of light emitted in the light emitting layer 123A is from 600 nm to 650 nm (specifically, 620 nm in Example 1), and a film thickness of the organic layer 123 on the first electrode 121 is from $1.1 \times 10^{-7}$ m to $1.6 \times 10^{-7}$ m (specifically, 125 nm in Example 1).

Specifically, the constitution of the red light emitting organic layer is shown in the following Table 3. A maximum light emitting position is an interface between the electron transport layer 123C and the light emitting layer 123A (see FIG. 2A). In Table 3 or Tables 4 and 5 as described later, it is meant that a layer located in a lower row is located closer to the first electrode. When a common layer is the blue light emitting layer, and blue light emitting energy causes energy movement to the red light emitting layer, it is possible to contrive to enhance the luminous efficiency of the red light emitting layer. Also, by forming a common layer entirely on the light emitting layer in the red light emitting organic layer and the light emitting layer in the green light emitting organic layer, the light emitting layer constituting the blue light emitting organic layer can be formed without being individually formed. For example, a mask for forming the light emitting layer constituting the blue light emitting organic layer becomes unnecessary, and the mass productivity is enhanced.

TABLE 3

| | Material | Film thickness |
|---|---|---|
| Electron transport layer | Idemitsu Kosan: ETS030 | 15 nm |
| Common layer | Idemitsu Kosan: BH232 + BDS029 (5% doped) | 30 nm |
| Light emitting layer | Idemitsu Kosan: RH001 + Toray: D125 (0.5% doped) | 50 nm |
| Hole transport layer | Idemitsu Kosan: HT550 | 22 nm |
| Hole injection layer | Material represented by the formula (C) | 8 nm |

Also, the green light emitting device (green light emitting organic EL device) resonates light emitted in the light emitting layer 123A between the first interface 26 and the second interface 27, and a part of the light is then outputted from the semi-transmissive reflective film 40. A maximum peak wavelength of a spectrum of light emitted in the light emitting layer 123A is from 500 nm to 550 nm (specifically, 530 nm in Example 1), and a film thickness of the organic layer 123 on the first electrode 121 is from $9 \times 10^{-8}$ m to $1.3 \times 10^{-7}$ m (specifically, 104 nm in Example 1).

Specifically, the constitution of the green light emitting organic layer is shown in the following Table 4. A maximum light emitting position is an interface between the hole transport layer 123B and the light emitting layer 123A (see FIG. 2B).

TABLE 4

| | Material | Film thickness |
|---|---|---|
| Electron transport layer | Idemitsu Kosan: ETS030 | 15 nm |
| Common layer | Idemitsu Kosan: BH232 + BDS029 (5% doped) | 30 nm |
| Light emitting layer | Idemitsu Kosan: BH085 + GD242 (10% doped) | 29 nm |
| Hole transport layer | Idemitsu Kosan: HT550 | 22 nm |
| Hole injection layer | Material represented by the formula (C) | 8 nm |

Also, the blue light emitting device (blue light emitting organic EL device) resonates light emitted in the light emitting layer 123A between the first interface 26 and the second interface 27, and a part of the light is then outputted from the semi-transmissive reflective film 40. A maximum peak wavelength of a spectrum of light emitted in the light emitting layer 123A is from 430 nm to 480 nm (specifically, 460 nm in Example 1), and a film thickness of the organic layer 123 on the first electrode 121 is from $6 \times 10^{-8}$ m to $1.1 \times 10^{-7}$ m (specifically, 75 nm in Example 1).

Specifically, the constitution of the blue light emitting organic layer is shown in the following Table 5. A maximum light emitting position is an interface between the hole transport layer 123B and the light emitting layer 123A (see FIG. 2B).

TABLE 5

| | Material | Film thickness |
|---|---|---|
| Electron transport layer | Idemitsu Kosan: ETS030 | 15 nm |
| Light emitting layer | Idemitsu Kosan: BH232 + BDS029 (5% doped) | 30 nm |
| Hole transport layer | Idemitsu Kosan: HT550 | 22 nm |
| Hole injection layer | Material represented by the formula (C) | 8 nm |

A voltage drop in such a resistive layer 50 is as follows. Here, specifications of each of the second electrode 122 and the resistive layer 50 are as follows.

[Second Electrode 122]
Electrical resistivity ($\rho_1$): $3.0 \times 10^{-4}$ Ω·cm
Film thickness ($d_1$): 0.1 μm
Current density ($J_1$) flowing through the second electrode 122: 10 mA/cm²

[Resistive Layer 50]
Electrical resistivity ($\rho_2$): $1.0 \times 10^4$ Ω·cm to $1.0 \times 10^6$ Ω·cm
Film thickness ($d_2$): 0.5 μm
Current density ($J_2$) flowing through the resistive layer 50: 10 mA/cm²

Sheet resistance of the second electrode 122=$(\rho_1/d_1)$=30Ω/□

Sheet resistance of the resistive layer 50=$(\rho_2/d_2)$=$2 \times 10^8$Ω/□ to $2 \times 10^{10}$Ω/□

Voltage drop in the second electrode 122=$\rho_1 \times d_1 \times J_1$=$3.0 \times 10^{-11}$ V Voltage drop in the resistive layer 50=$\rho_2 \times d_2 \times J_2$=5 mV to 500 mV In the light of the above, in the case where the resistive layer 50 is constituted of $Nb_2O_5$, the voltage drop in the resistive layer 50 can be estimated to be about 0.5 V at maximum, and this value is a value of voltage drop which will not create an exceptional problem in driving an organic EL device or an organic EL display apparatus.

Values of λ, $L_1$, $OL_1$, $2OL_1/\lambda$, $L_2$, $OL_2$, $2OL_2/\lambda$, $n_{ave}$, $\{-2\Phi_1/(2\pi)+m_1\}$ and $\{-2\Phi_2/(2\pi)+m_2\}$ in the red light emitting organic layer, the green light emitting organic layer and the blue light emitting organic layer are exemplified in the following Table 6. However, $m_1$ is 0, and $m_2$ is 0.

TABLE 6

| | Unit | Red light emitting organic layer | Green light emitting organic layer | Blue light emitting organic layer |
|---|---|---|---|---|
| λ | nm | 620 | 530 | 460 |
| $L_1$ | nm | 80 | 58 | 38 |
| $OL_1$ | nm | 144 | 110 | 75.2 |
| $2OL_1/\lambda$ | | 0.465 | 0.416 | 0.327 |
| $L_2$ | nm | 60 | 60 | 50 |
| $OL_2$ | nm | 107 | 109 | 93.8 |
| $2OL_2/\lambda$ | | 0.345 | 0.410 | 0.408 |
| $n_{ave}$ | | 1.793 | 1.854 | 1.920 |
| $-\Phi_1/(2\pi) + m_1$ | | 0.399 | 0.380 | 0.357 |
| $-\Phi_2/(2\pi) + m_2$ | | 0.369 | 0.361 | 0.352 |

Figure 3:
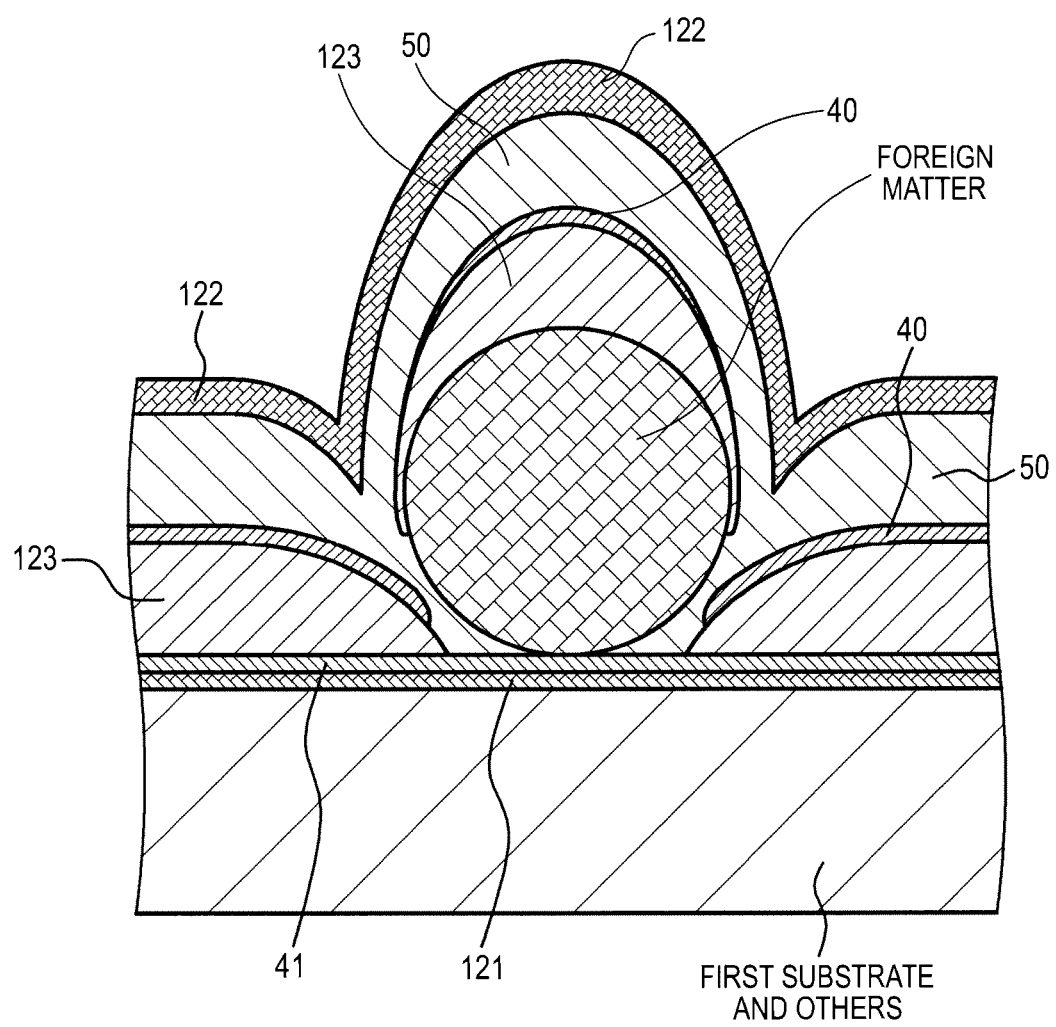
FIG. 3 is a partial sectional view schematically showing a film-deposited state of an organic layer and the like when in an organic electroluminescence display apparatus in Example 1, a foreign matter is present on a first electrode.

A foreign matter (particle) often attaches onto the first electrode 121 at the time of forming the first electrode 121 or the like or at the time of conveyance. Also, a protruding part from the first electrode 121 is often produced at the time of forming the first electrode 121 or the like. Furthermore, a difference in level is often produced at the time of forming the organic layer 123. As schematically shown in FIG. 3, coverage of the organic layer 123 does not become complete due to such a foreign or protruding part. However, in view of the fact that the semi-transmissive reflective film 40 having a very thin thickness as from 1 nm to 6 nm is formed on the organic layer 123, in the case where a foreign matter or a protruding part is present on the first electrode 121, and a difference in level is present, a kind of "stepped cut" is caused in a neighborhood of the foreign matter or protruding part or the difference in level at the time of film deposition of the semi-transmissive reflective film 40, whereby the semi-transmissive reflective film 40 is not formed in a neighborhood of the foreign matter or protruding part or the difference in level. Since the resistive layer 50 is formed in that state, there is revealed a state in which the resistive layer 50 is present between the portion of the semi-transmissive reflective film 40 located in the surroundings of the foreign matter or protruding part and the portion of the first electrode 121 located beneath the foreign matter or in a root of the protruding part.

Figure 4:
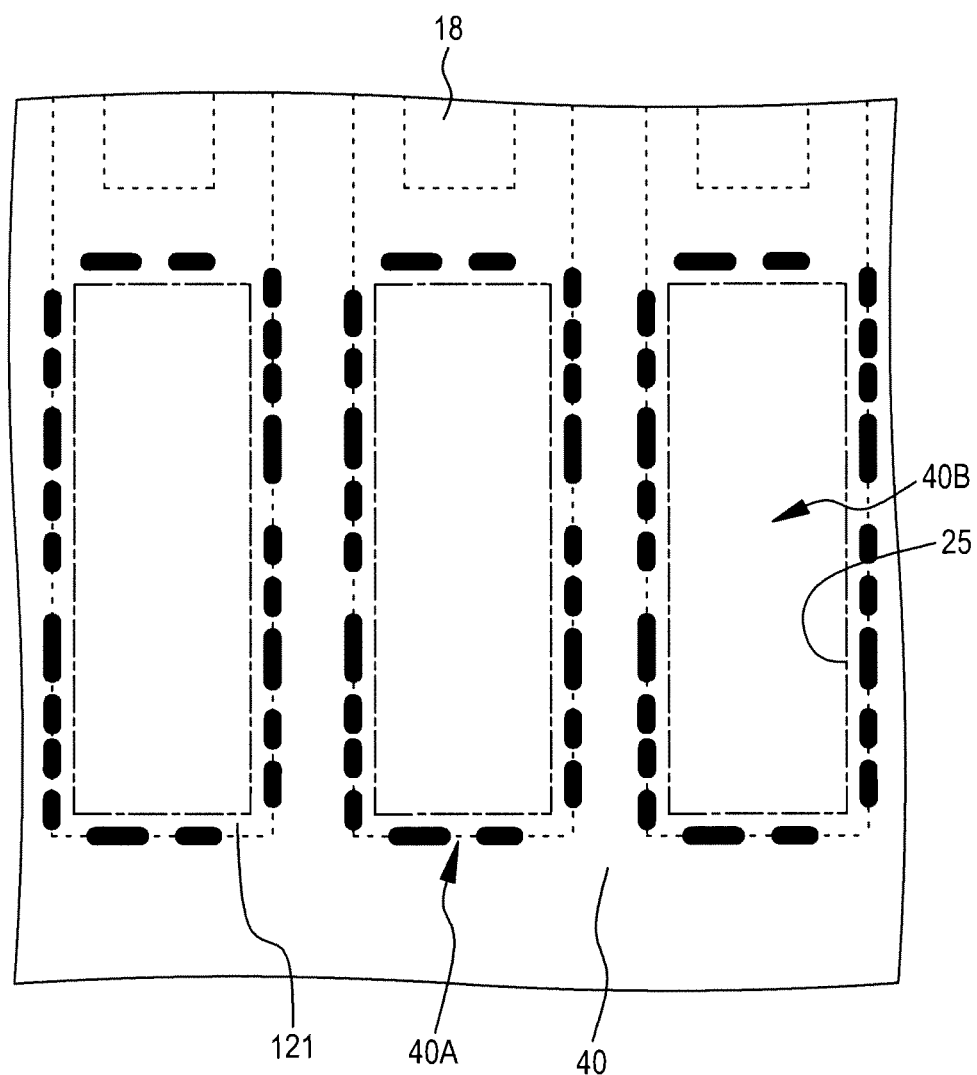
FIG. 4 is a schematic disposition view of an organic layer and the like in an organic electroluminescence display apparatus in Example 1.

Also, as described previously, since the average film thickness of the portion 40B of the semi-transmissive reflective film 40 on the organic layer 123 is regulated to from 1 nm to 6 nm, the portion 40A of the semi-transmissive reflective film 40 on the insulating layer 24 becomes in a discontinuous state. More specifically, the organic layer 123 having the light emitting layer 123A provided therein is provided extending from an upper part of a portion of the first electrode 121 exposed on the bottom of the opening 25 to a portion of the insulating layer 24 surrounding the opening 25, and the semi-transmissive reflective film 40 is also provided extending from an upper part of the organic layer 123 to a portion of the insulating layer 24 surrounding the opening 25. Here, the portion of the insulating layer 24 surrounding the opening 25 is provided with an inclination downward the opening 25. In consequence, a film thickness of the portion 40A of the semi-transmissive reflective film 40 on the portion of the insulating layer 24 surrounding the opening 25 becomes thinner than a film thickness of the portion 40B of the semi-transmissive reflective film 40 on the organic layer 123. Therefore, the portion 40A of the semi-transmissive reflective film 40 on the portion of the insulating layer 24 surrounding the opening 25 becomes in a discontinuous state (disconnected state). This state is schematically shown in FIG. 4. The discontinuous portions of the semi-transmissive reflective film 40 are painted in solid black. Also, each of the contact plug 18 and the first electrode 121 is shown by a dotted line, and an edge of the opening 25 is shown by an alternate long and short dash line. Though FIG. 4 is illustrated in such a manner that discontinuous portions are regularly provided, the discontinuous portions are actually irregularly provided.

When a voltage is impressed to the first electrode 121 and the second electrode 122 for the purpose of driving the light emitting device, the resistive layer 50 is present between the first electrode 121 and the second electrode 122; and therefore, even when a foreign matter or a protruding part is present, a short circuit is not caused between the first electrode 121 and the second electrode 122, the first electrode 121 and the semi-transmissive reflective film 40 do not come into contact with each other, and it is possible to surely prevent the generation of a defective pixel or a missing line. When the first electrode 121 and the semi-transmissive reflective film 40 come into contact with each other, the first electrode 121 and the semi-transmissive reflective film 40 have the same potential so that light emission does not occur in the organic layer 123.

In the light emitting device of Example 1, since the conductor film 41 is formed between the first electrode 121 and the organic layer 123, it becomes possible to contrive to reduce the electrical resistance extending from the organic layer 123 to the first electrode 121. As a result, it is possible to contrive to lower the drive voltage. Specifically, as compared with a light emitting device in which the conductor film 41 is not formed between the first electrode 121 and the organic layer 123, the drive voltage could be reduced by from 1.1 V to 1.32 V in the light emitting device of Example 1 having the conductor film 41 formed therein.

The outline of a manufacturing method of the light emitting device and the organic EL display apparatus of Example 1 are hereunder described by reference to FIGS. 5A to 5C, FIGS. 6A to 6B and FIGS. 7A to 7B.

[Step 100]

First of all, TFT is formed for every sub-pixel on the first substrate 11 by a known method. TFT is constituted of the gate electrode 12 formed on the first substrate 11; the gate insulating film 13 formed on the first substrate 11 and the gate electrode 12; the source/drain region 14 provided in a semiconductor layer formed on the gate insulating film 13; and the channel forming region 15 which is located between the source/drain regions 14 and to which a portion of the semiconductor layer located above the gate electrode 12 is corresponding. In the illustrated example, TFT is formed in a bottom gate type, but it may be of a top gate type. The gate electrode 12 of TFT is connected to a scanning circuit (not illustrated). Subsequently, a lower interlayer insulating layer 16A made of $SiO_2$ is subjected to film deposition on the first substrate 11 so as to cover TFT by a CVD method, and thereafter, an aperture 16' is formed in the lower interlayer insulating layer 16A on the basis of a photolithography technology and an etching technology (see FIG. 5A).

[Step 110]

Subsequently, the wiring 17 made of aluminum is formed on the lower interlayer insulating layer 16A on the basis of a combination of a vacuum vapor deposition method and an etching method. The wiring 17 is electrically connected to the source/drain region 14 of TFT via the contact plug 17A provided within the aperture 16'. The wiring 17 is connected to a signal supply circuit (not illustrated). Then, the upper interlayer insulating layer 16B made of $SiO_2$ is subjected to film deposition on the whole surface of the wiring 17 by a CVD method. Subsequently, an aperture 18' is formed on the upper interlayer insulating layer 16B on the basis of a photolithography technology and an etching technology (see FIG. 5B).

[Step 120]

Figure 5A:
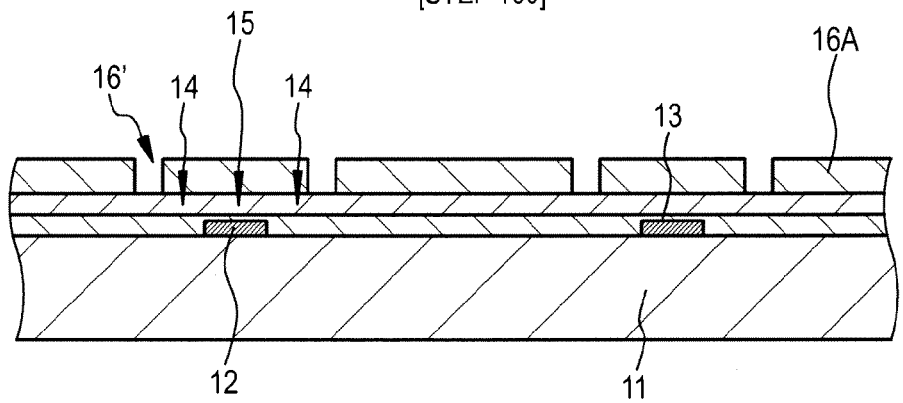
FIGS. 5A, 5B and 5C are schematic partial end views of a first substrate and the like for explaining an outline of a manufacturing method of a light emitting device and an organic electroluminescence display apparatus of Example 1.
Figure 5B:
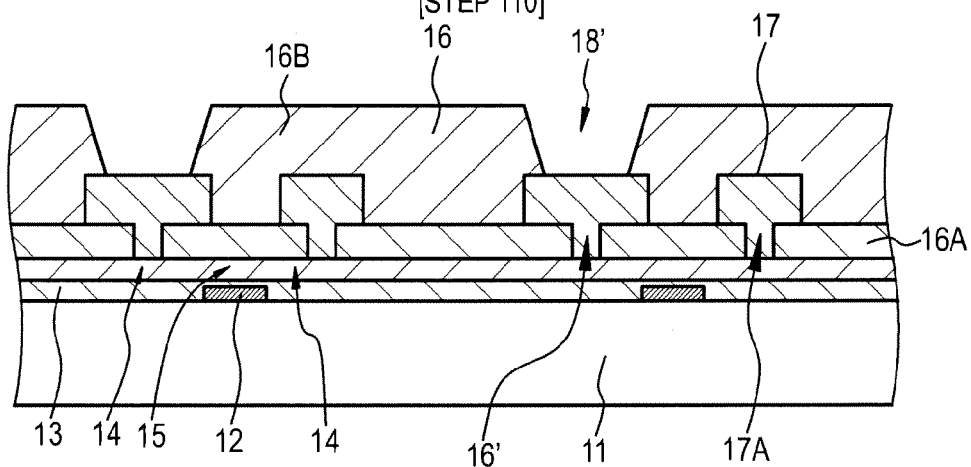
Figure 5C:
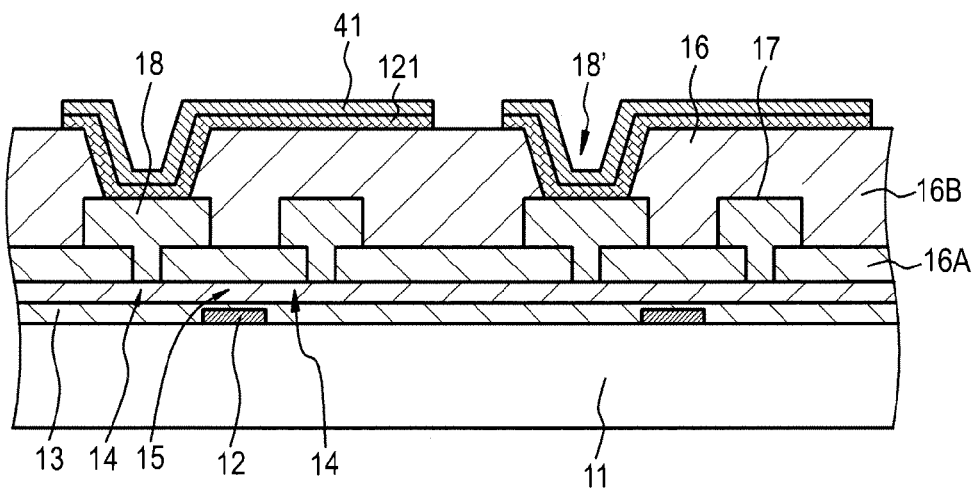

Thereafter, the first electrode 121 made of an Al—Nd alloy and the conductor film 41 are formed on the upper interlayer insulating layer 16B on the basis of a combination of a vacuum vapor deposition method and an etching method (see FIG. 5C). The first electrode 121 is electrically connected to the wiring 17 via the contact plug 18 provided within the aperture 18'.

[Step 130]

Figure 6A:
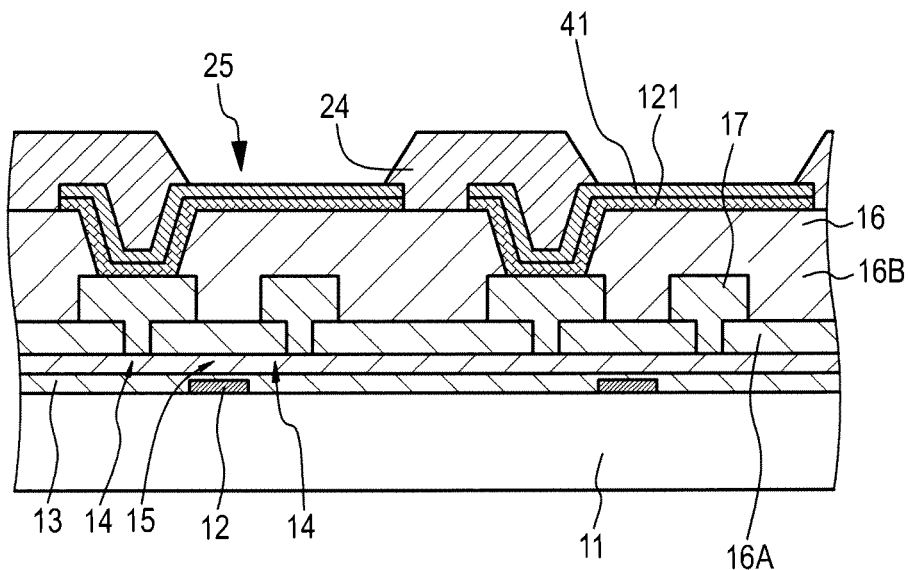
FIGS. 6A and 6B are schematic partial end views of the first substrate and the like for explaining an outline of the manufacturing method of a light emitting device and an organic electroluminescence display apparatus of Example 1, subsequent to FIG. 5C.

Subsequently, the insulating layer 24 having the opening 25, in which the first electrode 121 (more specifically, the conductor film 41) is exposed on a bottom of the opening 25, is formed on the interlayer insulating layer 16 including the first electrode 121 (more specifically, the conductor film 41) (see FIG. 6A). Specifically, the insulating layer 24 made of a polyimide resin having a thickness of 1 μm is formed on the interlayer insulating layer 16 and on a surrounding area of the first electrode 121 (more specifically, the conductor film 41) on the basis of a spin coating method and an etching method. It is preferable that the portion of the insulating layer 24 surrounding the opening 25 constitutes a gentle slope.

[Step 140]

Figure 6B:
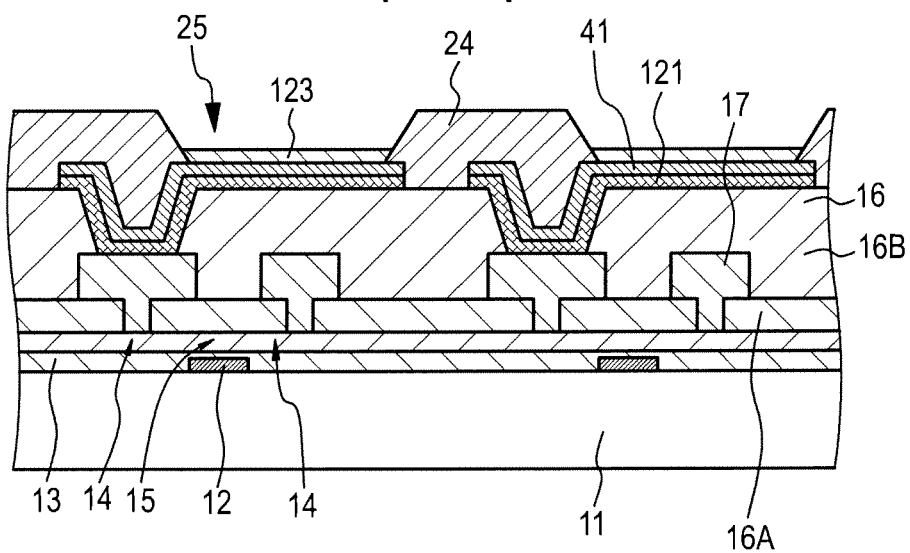

Subsequently, the organic layer 123 is formed extending from an upper part of the portion of the first electrode 121 exposed on the bottom of the opening 25 (more specifically, an upper part of the conductor film 41) to the portion of the insulating layer 24 surrounding the opening 25 (see FIG. 6B). In the organic layer 123, for example, a hole transport layer made of an organic material and a light emitting layer also functioning as an electron transport layer are successively laminated. Specifically, the organic material is subjected to vacuum vapor deposition on the basis of resistance heating while working the insulating layer 24 as a kind of a spacer in a state in which a metal mask (not illustrated) for forming the organic layer 123 constituting each sub-pixel on the insulating layer 24 is placed on the protruding part of the insulating layer 24. The organic material passes through an aperture provided in the metal mask and is deposited extending from an upper part of the portion of the first electrode 121 exposed on the bottom of the opening 25 constituting the sub-pixel (more specifically, an upper part of the conductor film 41) to an upper part of the portion of the insulating layer 24 surrounding the opening 25.

[Step 150]

Figure 7A:
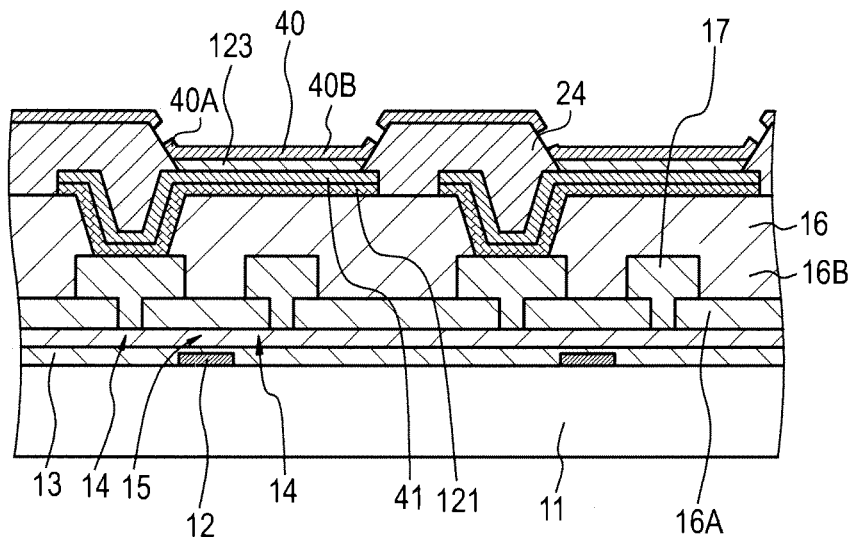
FIGS. 7A and 7B are schematic partial end views of the first substrate and the like for explaining an outline of the manufacturing method of a light emitting device and an organic electroluminescence display apparatus of Example 1, subsequent to FIG. 6B.

Thereafter, the semi-transmissive reflective film 40 having an average film thickness of 5 nm on the organic layer 123 is formed on the whole surface of a display region (see FIG. 7A). The semi-transmissive reflective film 40 covers the whole surface of the organic layer 123 constituting (N×M) organic EL devices. However, as described previously, the portion 40A of the semi-transmissive reflective film 40 on the insulating layer 24 is at least partially discontinuous. The semi-transmissive reflective film 40 is formed on the basis of a vacuum vapor deposition method which is a film deposition method with small energy of film-deposited particles to an extent that the organic layer 123 is not influenced and with poor coverage. Also, by continuously forming the semi-transmissive reflective film 40 within the same vacuum vapor deposition apparatus as in the formation of the organic layer 123 without exposing the organic layer 123 to the air, it is possible to prevent deterioration of the organic layer 123 to be caused due to moisture or oxygen in the air. Specifically, by subjecting a co-vapor deposited film of Mg—Ag (volume ratio: 10/1) to film deposition, the semi-transmissive reflective film 40 can be obtained. In the film deposition of the semi-transmissive reflective film 40, it would be better that the coverage is poor for the purpose of obtaining a discontinuous state. In consequence, it is preferable to make a pressure at the time of film deposition low, and specifically, the pressure is desirably not more than $1\times10^{-3}$ Pa.

[Step 160]

Subsequently, the resistive layer 50 made of niobium oxide ($Nb_2O_5$) having an electrical resistivity of $1\times10^8$ Ω·m ($1\times10^6$ Ω·cm), whose thickness in an upper part of the organic layer 123 is 0.5 μm, is formed by a sputtering method. Though the resistivity layer 50 comes into contact with the second electrode 122, assuming that a current flowing through the resistive layer 50 can be suppressed to not more than ⅒ of a current flowing the whole of a single sub-pixel by making the resistance value high, even when the state shown in FIG. 3 is caused, such a state is not recognized as a drawback or a defect such as a dark spot and a semi-dark spot in a displayed image. In the case where the resistive layer 50 is constituted of $Nb_2O_5$, the characteristics required for the resistive layer 50 are calculated to be as described previously, and the electrical resistivity is preferably from $1\times10^6$ Ω·m to $1\times10^8$ Ω·m. Also, taking into consideration coverage due to wrapping-around at the time of film deposition of the resistive phase 50, it is preferable that the pressure at the time of film deposition is high, and the pressure is desirably from 0.1 Pa to 10 Pa. Also, in the case where the resistive layer 50 is constituted of an oxide semiconductor, there may be the case where the electrical resistivity of the resistive layer 50 is changed due to an oxygen concentration (oxygen partial pressure) at the time of film deposition. However, in the case where the resistive layer 50 is constituted of $Nb_2O_5$, even when the oxygen concentration at the time of film deposition is changed (specifically, for example, the oxygen partial pressure is changed from $1\times10^{-4}$ Pa to $1\times10^{-2}$ Pa), the electrical resistivity is changed by only from $1\times10^6$ Ω·m to $1\times10^8$ Ω·m ($1\times10^4$ Ω·cm to $1\times10^6$ Ω·cm) so that a stable electrical resistivity can be obtained.

[Step 170]

Figure 7B:
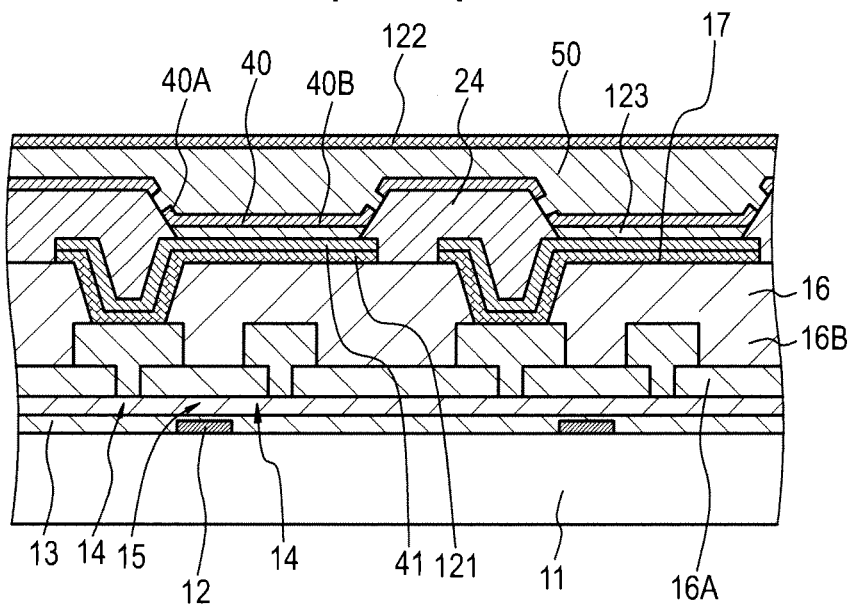

Thereafter, the second electrode 122 is formed on the whole surface of a display region (see FIG. 7B). The second electrode 122 covers the whole surface of the organic layer 123 constituting (N×M) organic EL devices. However, the second electrode 122 is insulated from the first electrode 121 by the resistive layer 50, the organic layer 123 and the insulating layer 24. The second electrode 122 is also formed on the basis of a magnetron sputtering method which is a film deposition method with small energy of film-deposited particles to an extent that the organic layer 123 is not influenced. Also, by continuously forming the second electrode 122 within the same vacuum vapor deposition apparatus as in the formation of the organic layer 123 without exposing the organic layer 123 to the air, it is possible to prevent deterioration of the organic layer 123 to be caused due to moisture or oxygen in the air. Specifically, the second electrode 122 can be obtained by subjecting an ITO layer having a thickness of 0.1 μm to film deposition on the whole surface.

[Step 180]

Subsequently, the insulating protective film 31 made of amorphous silicon nitride ($Si_{1-x}N_x$) is formed on the second electrode 122 on the basis of a plasma CVD method. By continuously forming the protective film 31 without exposing the second electrode 122 to the air, it is possible to prevent deterioration of the organic layer 123 to be caused due to moisture or oxygen in the air. Thereafter, the protective film 31 and the second substrate 33 are bonded to each other by the adhesive layer 32 made of an acrylic adhesive. Finally, the organic EL display apparatus can be completed through connection to an external circuit.

The semi-transmissive reflective film or conductor film can also be constituted of magnesium (Mg)-calcium (Ca) in place of the magnesium (Mg)-silver (Ag). Specifically, a volume ratio between magnesium and calcium is 9/1 in terms of Mg/Ca, and a film thickness of the semi-transmissive reflective film or conductor film is 2 nm. Such a semi-transmissive reflective film or conductor film can be subjected to film deposition by a vacuum vapor deposition method.

Example 2

Example 2 is concerned with a modification of Example 1, and the resistive layer has a structure in which a first resistive layer and a second resistive layer are laminated from the side of the organic layer and an electrical resistivity of the second resistive layer is higher than an electrical resistivity of the first resistive layer. In Example 2, a material constituting each of the first resistive layer and the second resistive layer is $Nb_2O_5$, and by changing an oxygen partial pressure at the time of film deposition of $Nb_2O_5$ by a sputtering method, electrical resistivities $R_1$ and $R_2$ of the first resistive layer and the second resistive layer were regulated, respectively as follows.

Electrical resistivity $R_1$ of the first resistive layer:
$1 \times 10^6$ Ω·m ($1 \times 10^4$ Ω·cm)
Electrical resistivity $R_2$ of the second resistive layer:
$1 \times 10^8$ Ω·m ($1 \times 10^6$ Ω·cm)

In measuring a voltage drop in the resistive layer, as compared with a measurement result of the voltage drop when the resistive layer was constituted of a single layer (electrical resistivity: $1 \times 10^8$ Ω·m ($1 \times 10^6$ Ω·cm)), in Example 2, a value of the voltage drop was small, and it was possible to contrive to realize a low voltage of the drive voltage.

With the exception of the point that the constitution of the resistive layer is different, the constitutions and structures of the organic EL display apparatus, the light emitting device and the organic EL device of Example 2 can be made identical with the constitutions and structures of the organic EL display apparatus, the light emitting device and the organic EL device of Example 1, and therefore, detailed descriptions thereof are omitted.

Example 3

Example 3 is also concerned with a modification of Example 1. In Example 1, an electrical resistance value (an electrical resistance value per unit area of the resistive layer; hereinafter the same) $R_R$ of the resistive layer constituting a red light emitting device, an electrical resistance value $R_G$ of the resistive layer constituting a green light emitting device and an electrical resistance value $R_B$ of the resistive layer constituting a blue light emitting device were made equal to each other. That is, the whole surface was uniformly covered by the resistive layer. Now, in general, an optical distance $L_B$ in a blue light emitting device with a short light emitting wavelength is shorter than optical distances $L_G$ and $L_R$ of a green light emitting device and a red light emitting device, respectively, each of which has a longer light emitting wavelength. Therefore, it is necessary to make a thickness of an organic layer in the blue light emitting device thinner than a thickness of an organic layer in each of the green light emitting device and the red light emitting device. Therefore, since a short circuit is most likely caused between a first electrode and a second electrode in the blue light emitting device, it is necessary to make the thickness of the resistive layer in the blue light emitting device the thickest. On the other hand, in general, a drive voltage of each of the blue light emitting device, the green light emitting device and the red light emitting device depends upon a material constituting each of the light emitting devices and a film thickness of the organic layer and tends to become high in the order of the blue light emitting device, the red light emitting device and the green light emitting device. However, it is preferable to make the drive voltages of the blue light emitting device, the green light emitting device and the red light emitting device uniform as far as possible. Also, in the case where the drive voltages of the blue light emitting device, the green light emitting device and the red light emitting device are scattered, it is preferable that the scattering in the drive voltage is small as far as possible. Furthermore, in the case where an area of the pixel is different, for example, in the case of (area of the red light emitting device)≤(area of the green light emitting device)<(area of the blue light emitting device), as the area of the pixel becomes large, the number of dark spots is easy to increase.

Figure 8:
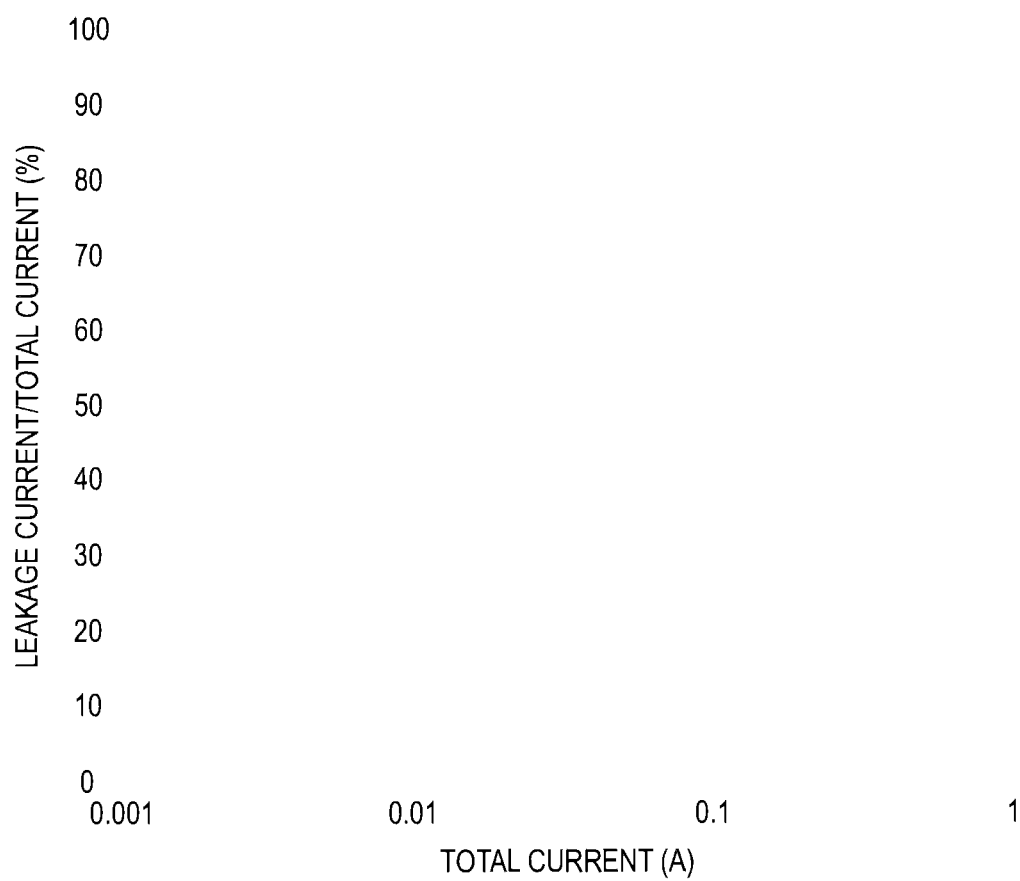
FIG. 8 is a graph showing simulation results of a proportion of a change of leakage current relative to a total current when the total current for driving pixels is changed.

FIG. 8 shows simulation results of a proportion of a change of leakage current relative to a total current when the total current for driving pixels is changed. When the total current becomes small, the proportion of the leakage current due to a foreign matter increases. Furthermore, when the resistance of the resistive layer becomes high, there is obtained a result that the leakage current is suppressed. In FIG. 8, a curve "A" is concerned with a data when the resistance of the resistive layer is $1 \times 10^4$Ω; a curve "B" is concerned with a data when the resistance of the resistive layer is $1 \times 10^5$Ω; and a curve "C" is concerned with a data when the resistance of the resistive layer is $1 \times 10^6$Ω.

In Example 3, in order to make the drive voltages of the blue light emitting device, the green light emitting device and the red light emitting device uniform as far as possible, a resistance value $R_R$ of the resistive layer constituting the red light emitting device per unit area, a resistance value $R_G$ of the resistive layer constituting the green light emitting device per unit area and a resistance value $R_B$ of the resistive layer constituting the blue light emitting device per unit area are made different from each other. That is, the resistance values are regulated in a way of ($R_B > R_G$) and ($R_B > R_R$). More specifically, the resistance values were regulated as follows.

$R_B = 150$ Ω·cm²
$R_G = 50$ Ω·cm²
$R_R = 100$ Ω·cm²

According to this, the drive voltages of the blue light emitting device, the green light emitting device and the red light emitting device can be made uniform; a rise of the drive voltage can be held to the minimum; and the generation of a short circuit between the first electrode and the second electrode can be surely suppressed.

For example, a thickness of the resistive layer constituting the red light emitting device, a thickness of the resistive layer constituting the green light emitting device and a thickness of the resistive layer constituting the blue light emitting device were made different from each other. Specifically, after film deposition of each of the resistive layers, the resistive layer constituting the red light emitting device is covered by a resist layer; the resistive layer constituting each of the green light emitting device and the blue light emitting device is exposed; and the resistive layer constituting each of the green light emitting device and the blue light emitting device is then subjected to partial etching in a thickness direction. Subsequently, the resist layer is removed; the resistive layer constituting each of the red light emitting device and the green light emitting device is covered by a resist layer; the resistive layer constituting the blue light emitting device is exposed; and the resistive layer constituting the blue light emitting device is then subjected to partial etching in a thickness direction. Alternatively, a constituent material of the resistive layer constituting the red light emitting device, a constituent material of the resistive layer constituting the green light emitting device and a constituent material of the resistive layer constituting the blue light emitting device may be made different from each other. Alternatively, a content of a material contributing to conductivity of the resistive layer constituting the red light emitting device, a content of a material contributing to conductivity of the resistive layer constituting the green light emitting device and a content of a material contributing to conductivity of the resistive layer constituting the blue light emitting device may be made different from each other.

Example 4

Figure 9:
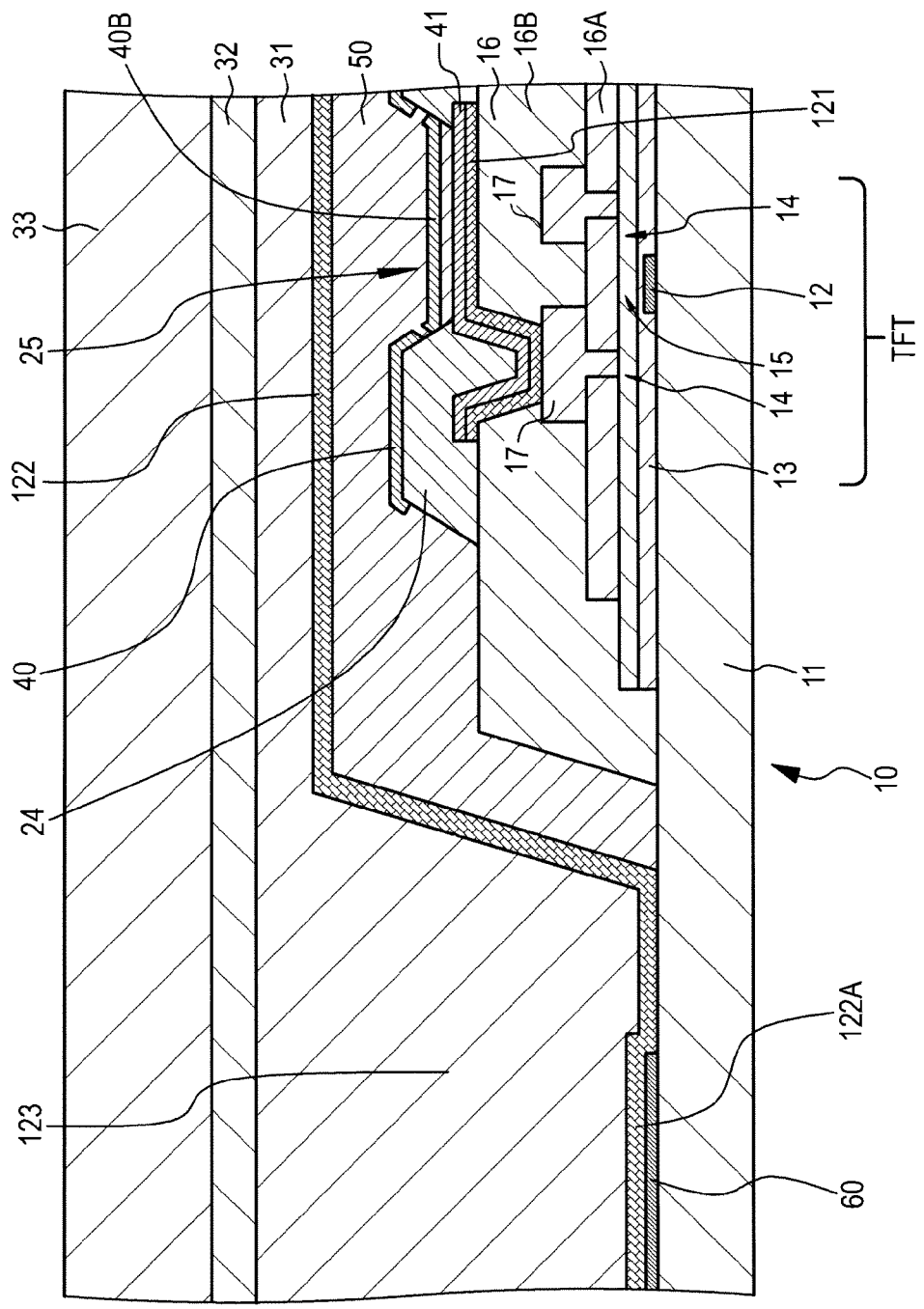
FIG. 9 is a schematic partial sectional view of a neighborhood of an outer periphery of an organic electroluminescence display apparatus in Example 4.
Figure 10:
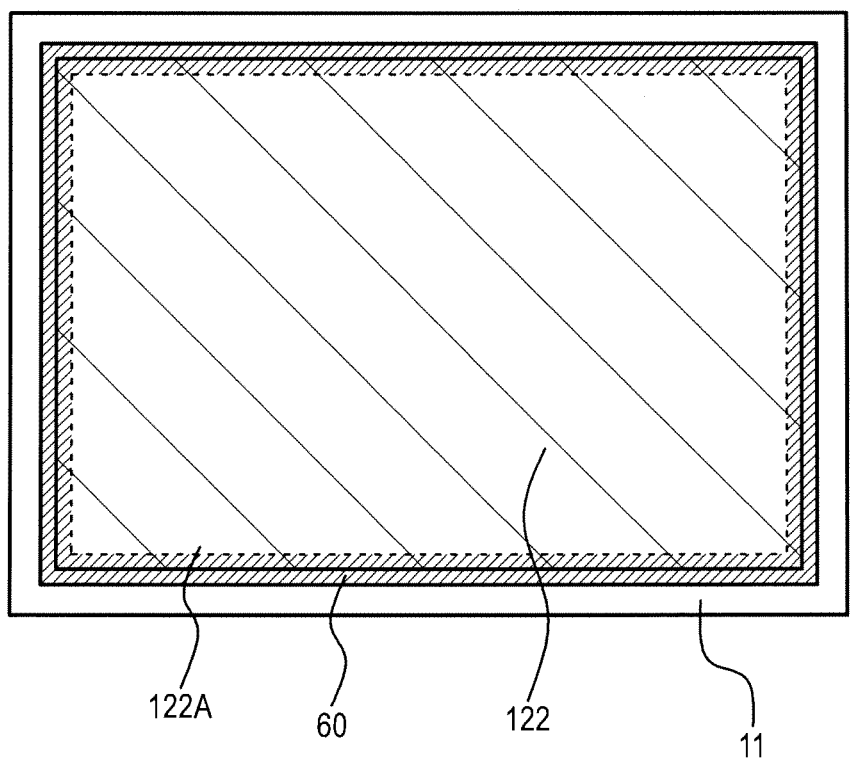
FIG. 10 is a view schematically showing disposition of an extraction electrode and a second electrode in a neighborhood of an outer periphery of an organic electroluminescence display apparatus in Example 4.

Example 4 is also concerned with a modification of Example 1. In Example 4, an extraction electrode 60 for connecting the second electrode 122 to an external circuit (not illustrated) is provided in an outer peripheral region of the organic EL display apparatus. In Example 4, the extraction electrode 60 is provided in an outer periphery of the first substrate 11 and is made of a titanium (Ti) film. An extending part 122A of the second electrode 122 extends to an upper part of the extraction electrode 60. A schematic partial sectional view of a neighborhood of the outer peripheral part of an organic EL display apparatus in Example 4 is shown in FIG. 9, and the disposition of the extraction electrode 60 and the second electrode 122 in the neighborhood of the outer peripheral part is shown in FIG. 10. In FIG. 10, an outer periphery of the extraction electrode 60 is shown by a solid line, whereas an inner periphery thereof is shown by a dotted line; and in order to clarify the extraction electrode 60, the extraction electrode 60 is provided with oblique lines extending from the upper right to the lower left. On the other hand, in order to clarify the second electrode 122 including the extending part 122A, the second electrode 122 is provided with oblique lines extending from the upper left to the lower right. For example, the extraction electrode 60 may be provided so as to surround a display region in a picture frame shape during any step of Step 100 to Step 130 or among these steps in Example 1 on the basis of, for example, a combination of a sputtering method and an etching method, a PVD method using a metal mask, a liftoff method or the like. In the case where a portion where the extraction electrode 60 overlaps a wiring of every kind or the like provided on the first substrate 11, an insulating film may be formed between the extraction electrode 60 and the wiring of every kind or the like.

Example 5

Example 5 is concerned with the light emitting device according to the second embodiment of the present invention. A schematic view of an organic layer and the like in the light emitting device of Example 5 is shown in each of FIGS. 12A and 12B. An organic EL display apparatus in Example 5 to which the light emitting device according to the second embodiment of the present invention is applied has the same constitution and structure as the organic EL display apparatus described in Example 1, except for points that the constitution of the organic layer is different; that the first electrode functions as a cathode electrode, whereas the second electrode functions as an anode electrode; and that the reference numbers are different. Also, a schematic partial sectional view thereof is the same as in FIG. 1. Therefore, its detailed description is omitted.

The light emitting device (organic EL device) of Example 5 includes (A) a first electrode 521, (B) an organic layer 523 having a light emitting layer 523A made of an organic light emitting material provided therein, (C) a semi-transmissive reflective film 40, (D) a resistive layer 50, and (E) a second electrode 522, all of which are laminated successively.

Different from Example 1, the organic layer 523 has a structure in which an electron transport layer 523C, the light emitting layer 523A, a hole transport layer 523B and a hole injection layer are laminated from the side of the first electrode 521. However, in the drawings, there may be the case where a single layer is expressed, whereas there may be the case where the hole injection layer and the hole transport layer are expressed by a single layer of the hole transport layer. Also, the first electrode 521 reflects light from the light emitting layer 523A, and the second electrode 522 transmits light having been transmitted through the semi-transmissive reflective film 40 therethrough. An average film thickness of the semi-transmissive reflective film 40 on the organic layer 523 is from 1 nm to 6 nm.

Also, the organic EL display apparatus in Example 5 has a plurality of the light emitting devices (organic EL devices) of Example 5 including (a) the first electrode 521, (b) the insulating layer 24 having the opening 25, in which the first electrode 521 is exposed on a bottom of the opening 25, (c) the organic layer 523 which is provided extending from an upper part of a portion of the first electrode 521 exposed on the bottom of the opening 25 to a portion of the insulating layer 24 surrounding the opening 25 and which is provided with the light emitting layer 523A made of an organic light emitting material, (d) the semi-transmissive reflective film 40 formed at least on the organic layer 523, (e) the resistive layer 50 covering the semi-transmissive reflective film 40, and (f) the second electrode 522 faulted on the resistive layer 50, all of which are laminated successively.

The organic layer 523 has a structure in which the electron transport layer 523C, the light emitting layer 523A, the hole transport layer 523B and a hole injection layer are laminated from the side of the first electrode 521;

the first electrode 521 reflects the light having been transmitted through the light emitting layer 523A;

the second electrode 522 transmits light having been transmitted through the semi-transmissive reflective film 40 therethrough;

an average film thickness of the semi-transmissive reflective film 40 on the organic layer 523 is from 1 nm to 6 nm; and a portion of the semi-transmissive reflective film 40 on the insulating layer 24 is at least partially discontinuous.

Even in Example 5, the portion of the organic layer 523 coming into contact with the semi-transmissive reflective film 40 (specifically, the hole injection layer) contains a pyrazine derivative represented by the foregoing formula (A) or a hexaazatriphenylene derivative represented by the foregoing formula (B) or (C). Also, similar to the light emitting device of Example 1, the conductor film 41 is provided between the first electrode 521 and the organic layer 523; the conductor film 41 transmits a part of light from the light emitting layer 523A therethrough; the first electrode 521 reflects the light having been transmitted through the conductor film 41; and an average film thickness of the conductor film 41 on the first electrode 521 is from 1 nm to 6 nm.

Here, in Example 5, the first electrode 521 is used as a cathode electrode, and the second electrode 522 is used as an anode electrode. Specifically, the first electrode 521 is made of a light reflective material such as an Al—Nd alloy having a thickness of 0.3 µm, and the second electrode 522 is made of a transparent conductive material such as ITO having a thickness of 0.1 µm. Similar to Example 1, the semi-transmissive reflective film 40 is made of an alkali metal or an alkaline earth metal and silver (Ag), and more specifically Mg—Ag having a thickness of 5 nm. Also, the conductor film 41 is made of an alkali metal or an alkaline earth metal and silver (Ag), and more specifically Mg—Ag having a thickness of 2 nm. Similar to Example 1, the resistive layer 50 is made of niobium oxide ($Ng_2O_5$) having an electrical resistivity of $1 \times 10^8$ Ω·m ($1 \times 10^6$ Ω·cm), and a thickness of the resistive layer 50 above the organic layer 523 is 0.5 µm. Different from Example 1, the electron injection layer made of LiF is not formed between the organic layer 523 and the semi-transmissive reflective film 40, and instead thereof, an electron injection layer (not illustrated) made of LiF having a thickness of 0.3 nm is formed between the organic layer 523 and the conductor film 41.

When the foregoing is summarized, a detailed constitution of the light emitting device of Example 5 is shown in the following Table 7. Also, a measurement result of a refractive index of each of the first electrode 521 and the second electrode 522, a measurement result of a light reflectance of the first electrode 521 and a measurement result of a light transmittance of each of the semi-transmissive reflective film 40 and the conductor film 41 are shown in the following Table 8. The measurements were carried out at a wavelength of 530 nm.

TABLE 7

| | |
|---|---|
| Second substrate 33 | Soda glass |
| Adhesive layer 32 | Acrylic adhesive |
| Protective film 31 | $SiN_x$ layer (thickness: 5 μm) |
| Second electrode (anode electrode) 522 | ITO layer (thickness: 0.1 μm) |
| Resistive layer 50 | $Nb_2O_5$ layer (thickness: 0.5 μm) |
| Semi-transmissive reflective film 40 | Mg—Ag film (thickness: 5 nm) |
| Electron injection layer | LiF layer (thickness: 0.3 nm) |
| Organic layer 523 | Described later |
| Conductor film 41 | Mg—Ag film (thickness: 2 nm) |
| First electrode (cathode electrode) 521 | Al—Nd layer (thickness: 0.3 μm) |
| Interlayer insulating layer 16 | $SiO_2$ layer |
| TFT | Constituting the organic EL device driving part |
| First substrate 11 | Soda glass |

TABLE 8

| Refractive index of the first electrode 521 | |
|---|---|
| Real part: | 0.755 |
| Imaginary part: | 5.466 |
| Refractive index of each of the semi-transmissive reflective film 40 and the conductor film 41 | |
| Real part: | 0.617 |
| Imaginary part: | 3.904 |
| Refractive index of the second electrode 522 | |
| Real part: | 1.814 |
| Imaginary part: | 0 |
| Refractive index of the resistive layer 50 | |
| Real part: | 2.285 |
| Imaginary part: | 0 |
| Refractive index of the protective film 31 | |
| Real part: | 1.87 |
| Imaginary part: | 0 |
| Refractive index of the adhesive layer 32 | |
| Real part: | 1.53 |
| Imaginary part: | 0 |
| Light reflectance of the first electrode 521: | 85% |
| Light transmittance of each of the semi-transmissive reflective film 40 and the conductor film 41: | 79% |
| Light reflectance of the second electrode 522: | 2% |

Similar to Example 1, even in Example 5, though the portion 40A of the semi-transmissive reflective film 40 on the insulating layer 24 is at least partially discontinuous, the portion 40A of the semi-transmissive reflective film 40 on the insulating layer 24 is partially linked to the portion 40B of the semi-transmissive reflective film 40 on the organic layer 523. As the case may be, the portion 40A of the semi-transmissive reflective film 40 on the insulating layer 24 is not linked to the portion 40B of the semi-transmissive reflective film 40 on the organic layer 523. Alternatively, as the case may be, in a part of the organic EL devices, the portion 40A of the semi-transmissive reflective film 40 on the insulating layer 24 is linked to the portion 40B of the semi-transmissive reflective film 40 on the organic layer 523, and in the remaining organic EL devices, the portion 40A of the semi-transmissive reflective film 40 on the insulating layer 24 is not linked to the portion 40B of the semi-transmissive reflective film 40 on the organic layer 523. An average film thickness of the portion 40A of the semi-transmissive reflective film 40 on the insulating layer 24 is thinner than an average film thickness of the portion 40B of the semi-transmissive reflective film 40 on the organic layer 523. In consequence, by regulating the average film thickness of the portion 40B of the semi-transmissive reflective film 40 on the organic layer 523 to from 1 nm to 6 nm, the portion 40A of the semi-transmissive reflective film 40 on the insulating layer 24 can be surely made in a discontinuous state.

hen, the light emitted in the light emitting layer 523A is resonated between the first interface 26 constituted by an interface between the first electrode 521 and the organic layer 523 (more specifically, the conductor film 41) and the second interface 27 constituted by an interface between the semi-transmissive reflective film 40 and the organic layer 523, and a part of the light is then outputted from the semi-transmissive reflective film 40 and further the second electrode 522.

Figure 12A:
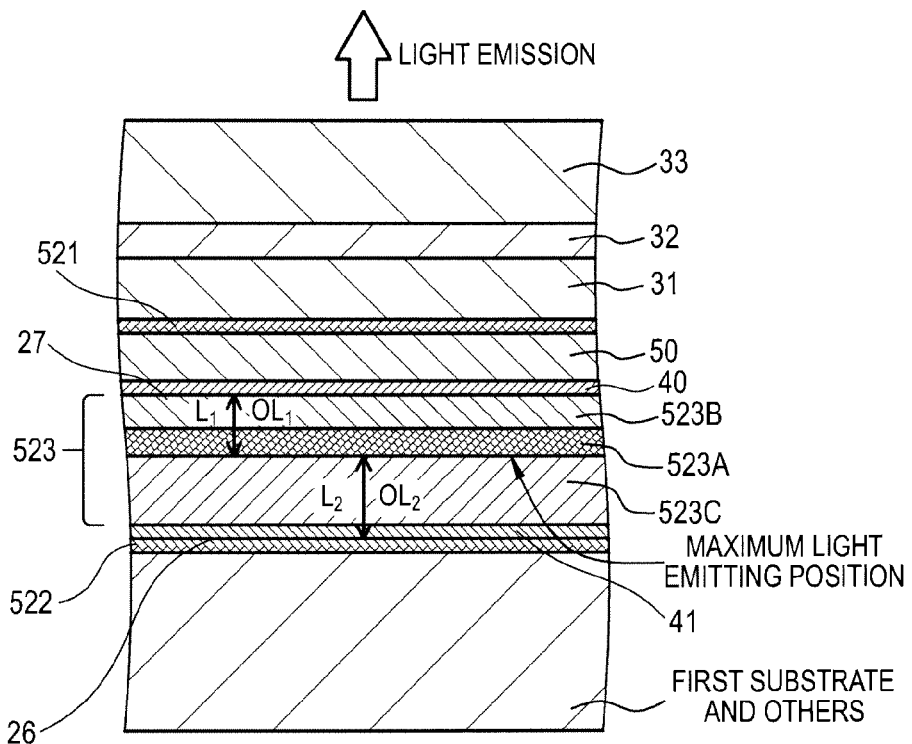
FIGS. 12A and 12B are schematic views of a light emitting device of Example 5.
Figure 12B:
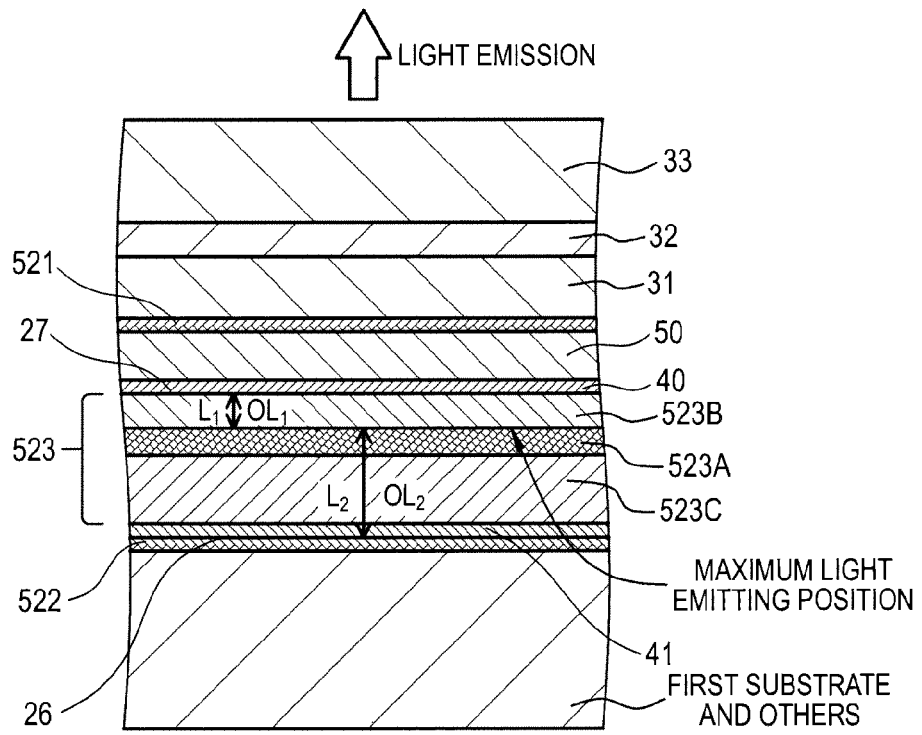

Also, in the light emitting device of Example 5, as shown in FIGS. 12A and 12B, when a distance from the first interface 26 to a maximum light emitting position of the light emitting layer 523A is defined as $L_1$ and its optical distance is defined as $OL_1$, and a distance from the second interface 27 to a maximum light emitting position of the light emitting layer 523A is defined as $L_2$ and its optical distance is defined as $OL_2$, the foregoing expressions (1-1) and (1-2) are satisfied.

Furthermore, in the light emitting device of Example 5, when an optical distance between the first interface 26 and the second interface 27 is defined as OL, a sum of phase shifts generated when light emitted in the light emitting layer 523A is reflected at the first interface 26 and the second interface 27 is defined as a Φ radian [wherein $-2n<\Phi \leq 0$], and a maximum peak wavelength of a spectrum of light emitted in the light emitting layer 523A is defined as λ, the following relation is satisfied.

$$-0.3 \leq \{(2 \times OL)/\lambda + \Phi/(2n)\} \leq 0.3$$

That is, the red light emitting device (red light emitting organic EL device) resonates light emitted in the light emitting layer 523A between the first interface 26 and the second interface 27, and a part of the light is then outputted from the semi-transmissive reflective film 40 and further the second electrode 522. A maximum peak wavelength of a spectrum of light emitted in the light emitting layer 523A is from 600 nm to 650 nm (specifically, 620 nm in Example 5), and a film thickness of the organic layer 523 on the first electrode 521 is from $1.1 \times 10^{-7}$ m to $1.6 \times 10^{-7}$ m (specifically, 125 nm in Example 5).

Specifically, the constitution of the red light emitting organic layer is shown in the following Table 9. A maximum light emitting position is an interface between the electron transport layer and the light emitting layer (see FIG. 12A). In Table 9 or Tables 10 and 11 as described later, it is meant that a layer located in a lower row is located closer to the first electrode.

TABLE 9

| Material | | Film thickness |
|---|---|---|
| Hole injection layer | Material represented by the formula (C) | 8 nm |
| Hole transport layer | Idemitsu Kosan: HT550 | 22 nm |
| Light emitting layer | Idemitsu Kosan: RH001 + Toray: D125 (0.5% doped) | 50 nm |
| Common layer | Idemitsu Kosan: BH232 + BDS029 (5% doped) | 30 nm |
| Electron transport layer | Idemitsu Kosan: ETS030 | 15 nm |

Also, the green light emitting device (green light emitting organic EL device) resonates light emitted in the light emitting layer 523A between the first interface 26 and the second interface 27, and a part of the light is then outputted from the semi-transmissive reflective film 40. A maximum peak wavelength of a spectrum of light emitted in the light emitting layer 523A is from 500 nm to 550 nm (specifically, 530 nm in Example 5), and a film thickness of the organic layer 523 on the first electrode 521 is from $9 \times 10^{-8}$ m to $1.3 \times 10^{-7}$ m (specifically, 104 nm in Example 5).

Specifically, the constitution of the green light emitting organic layer is shown in the following Table 10. A maximum light emitting position is an interface between the hole transport layer and the light emitting layer (see FIG. 12B).

TABLE 10

| Material | | Film thickness |
|---|---|---|
| Hole injection layer | Material represented by the formula (C) | 8 nm |
| Hole transport layer | Idemitsu Kosan: HT550 | 22 nm |
| Light emitting layer | Idemitsu Kosan: BH085 + GD242 (10% doped) | 29 nm |
| Common layer | Idemitsu Kosan: BH232 + BDS029 (5% doped) | 30 nm |
| Electron transport layer | Idemitsu Kosan: ETS030 | 15 nm |

Also, the blue light emitting device (blue light emitting organic EL device) resonates light emitted in the light emitting layer 523A between the first interface 26 and the second interface 27, and a part of the light is then outputted from the semi-transmissive reflective film 40. A maximum peak wavelength of a spectrum of light emitted in the light emitting layer 523A is from 430 nm to 480 nm (specifically, 460 nm in Example 5), and a film thickness of the organic layer 523 on the first electrode 521 is from $6 \times 10^{-8}$ m to $1.1 \times 10^{-7}$ m (specifically, 75 nm in Example 5).

Specifically, the constitution of the blue light emitting organic layer is shown in the following Table 11. A maximum light emitting position is an interface between the hole transport layer and the light emitting layer (see FIG. 12B).

TABLE 11

| Material | | Film thickness |
|---|---|---|
| Hole injection layer | Material represented by the formula (C) | 8 nm |
| Hole transport layer | Idemitsu Kosan: HT550 | 22 nm |
| Light emitting layer | Idemitsu Kosan: BH232 + BDS029 (5% doped) | 30 nm |
| Electron transport layer | Idemitsu Kosan: ETS030 | 15 nm |

In the light emitting device of Example 5, the organic layer 523 has a structure in which the electron transport layer 523C, the light emitting layer 523A, the hole transport layer 523B and the hole injection layer are laminated from the side of the first electrode 521, and electron injection properties into the light emitting layer 523A are enhanced. As a result, it is possible to contrive to lower the drive voltage.

Specifically, as compared with the light emitting device of Example 1, in the light emitting device of Example 5, the drive voltage could be reduced by from 1.7 V to 2.6 V.

Figure 13A:
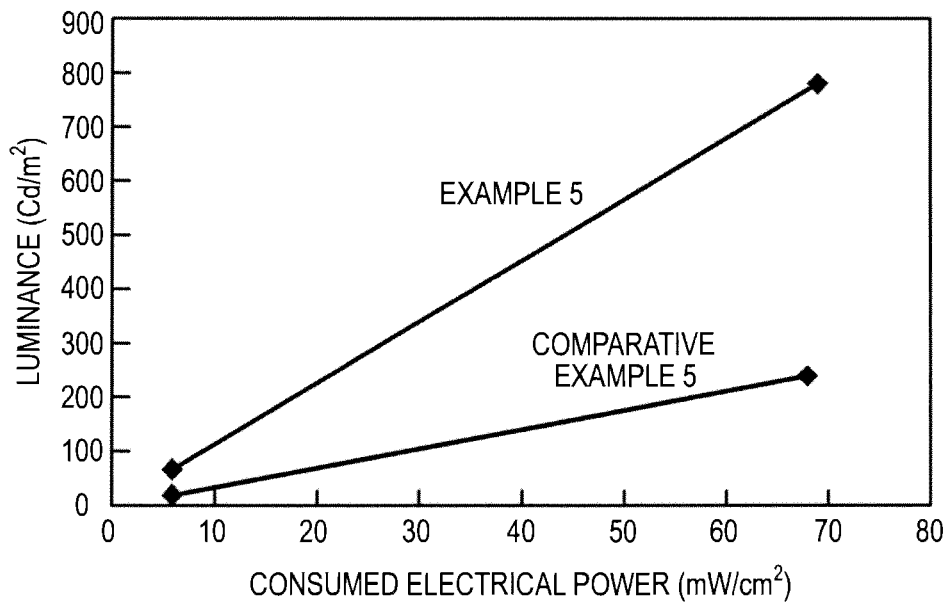
FIGS. 13A and 13B are graphs respectively showing a relation between a consumed electrical power and a luminance characteristic and a graph showing a relation between a drive voltage and a current density in a light emitting device of Example 5 and a light emitting device of Comparative Example 5.
Figure 13B:
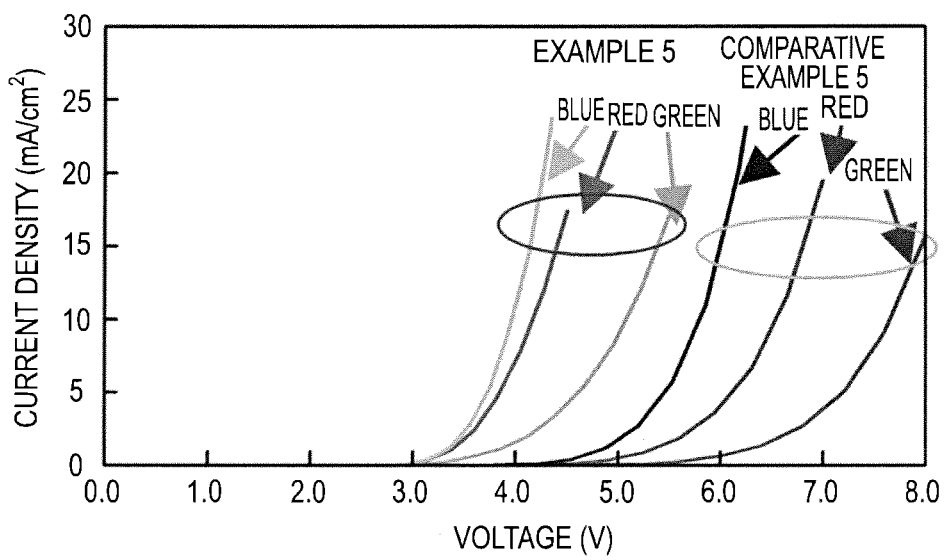
Figure 14:
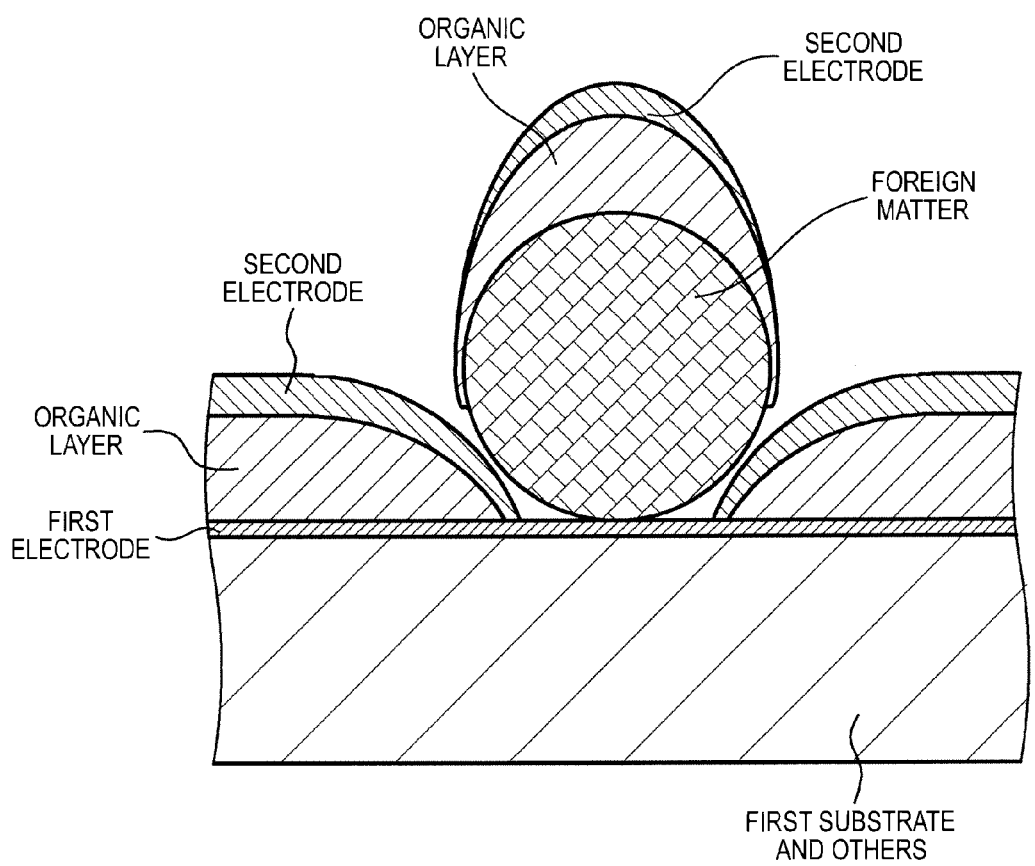
FIG. 14 is a partial sectional view schematically showing a film-deposited state of an organic layer and the like when a foreign matter is present on a first electrode in a related-art organic electroluminescence display apparatus.

Also, in the light emitting device of Example 5 and a light emitting device of Comparative Example 5 in which the conductor film 41 is not formed, a relation between a consumed electrical power and a luminance characteristic is shown in FIG. 13A, and a relation between a drive voltage and a current density is shown in FIG. 13B. As compared with the light emitting device of Comparative Example 5, in the light emitting device of Example 5, an enhancement of the luminance characteristic and a lowering of the current density are achieved.

The light emitting device and the organic EL display apparatus of Example 5 can be manufactured in the same method as in the light emitting device and the organic EL display apparatus of Example 1, and therefore, the description of the manufacturing method is omitted.

Needless to say, the light emitting devices described in Examples 2 to 4 can be applied to the light emitting device and the organic EL display apparatus of Example 5.

While the present invention has been described on the basis of the preferred working examples, it should not be construed that the present invention is limited to those working examples. The constitutions and structures of the light emitting device, the organic EL device and the organic EL display apparatus in the working examples, the materials constituting the light emitting device, the organic EL device and the organic EL display apparatus, and the like are merely exemplification to the last, and they can be properly modified.

In the working examples, while the organic layer was formed for every sub-pixel, as the case may be, there can also be formed a structure in which the organic layer constituting a blue light emitting sub-pixel extends over each of the red light emitting sub-pixel and the green light emitting sub-pixel. That is, there can also be formed a mode in which the organic layer constituting a blue light emitting sub-pixel is formed on the whole surface of the display region. In that case, as to the red light emitting sub-pixel, though a laminated structure of the organic layer for light emitting a red color and the organic layer for light emitting a blue color is provided, when a current is allowed to pass between the first electrode and the second electrode, red light emission occurs. Similarly, as to the green light emitting sub-pixel, though a laminated structure of the organic layer for light emitting a green color and the organic layer for light emitting a blue color is provided, when a current is allowed to pass between the first electrode and the second electrode, green light emission occurs.

Figure 11A:
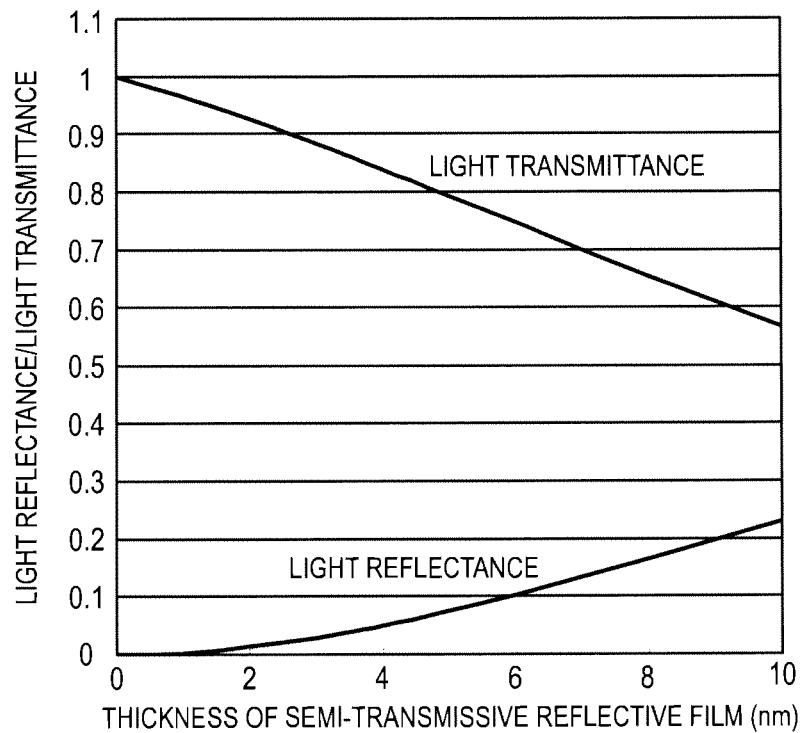
FIGS. 11A and 11B are graphs respectively showing a relation between a film thickness and a value of average light reflectance of a semi-transmissive reflective film and a graph showing a relation between an average light reflectance and a refractive index difference at an interface of a layer in a state in which two layers having a different refractive index from each other are laminated.
Figure 11B:
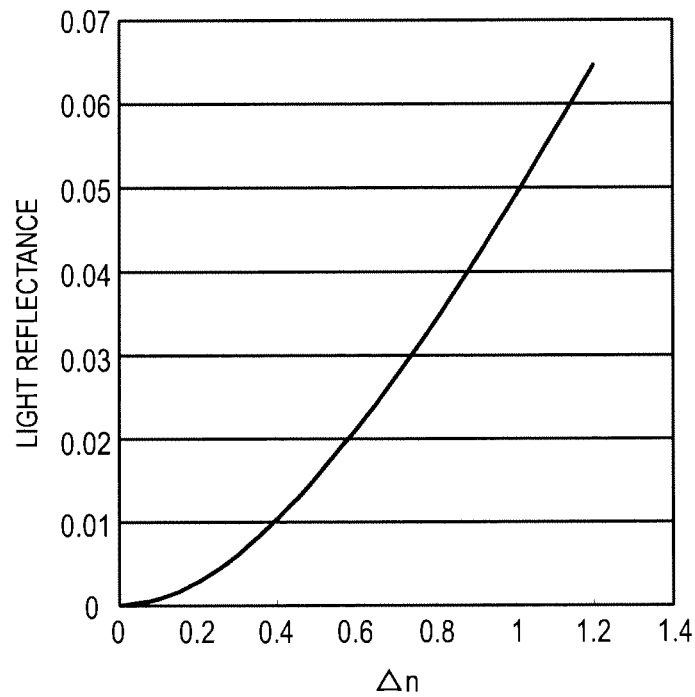

A relation between a film thickness and a value of average light reflectance at a wavelength of 530 nm of the semi-transmissive reflective film 40 is exemplified in FIG. 11A. As shown in FIG. 11A, as the film thickness of the semi-transmissive reflective film 40 becomes thin, the average light reflectance becomes close to 0. In consequence, as the film thickness of the semi-transmissive reflective film 40 becomes thin, the semi-transmissive reflective film 40 becomes to transmit almost all of lights therethrough. Also, when light at a wavelength of 530 nm is made incident from a certain layer A into a layer B coming into contact with the layer A, a relation between an average light reflectance when the light is reflected at an interface between the layer A and the layer B and a difference Δn in a refractive index between a material constituting the layer A and a material constituting the layer B is exemplified in FIG. 11B. As shown in FIG. 11B, a value of the average reflectance increases with an increase of a value of Δn on the basis of the Fresnel reflection.

In consequence, when the film thickness of the semi-transmissive reflective film 40 becomes thin, whereby the semi-transmissive reflective film 40 transmits almost all of lights therethrough, reflection is caused at a third interface which is an interface between the semi-transmissive reflective film 40 and the resistive layer 50. Alternatively, in the case where the resistive layer 50 has a laminated structure of at least two layers of resistive layers, reflection is caused chiefly at a fourth interface which is an interface between the first resistive layer and the second resistive layer depending upon constituent materials of the semi-transmissive reflective layer 40 and the resistive layer having a laminated structure and the like. As a result, the light emitted in the light emitting layer can be resonated between the first interface and the third interface constituted by the interface between the semi-transmissive reflective film 40 and the resistive layer 50; alternatively, the light emitted in the light emitting layer can be resonated between the first interface and the fourth interface constituted by the interface between the first resistive layer and the second resistive layer; or alternatively, not only the light emitted in the light emitting layer can be resonated between the first interface and the third interface, but the light emitted in the light emitting layer can be resonated between the first interface and the fourth interface.

In consequence, in such case, instead of defining the distance of from the second interface to the maximum light emitting position of the light emitting layer as $L_2$ and the optical distance as $OL_2$, respectively, a distance of from the third interface or fourth interface to the maximum light emitting position of the light emitting layer may be defined as $L_2$, and an optical distance may be defined as $OL_2$. Also, $\Phi_2$ may be defined as a phase shift amount (unit: radian) of reflected light generated at the third interface or fourth interface [wherein $-2n<\Phi_2\leq 0$]. Alternatively, instead of defining the optical distance between the first interface and the second interface as OL and the sum of phase shifts generated when light emitted in the light emitting layer is reflected at the first interface and the second interface as a Φ radian [wherein $-2n<\Phi\leq 0$], respectively, an optical distance between the first interface and the third interface or fourth interface may be defined as OL, and a sum of phase shifts generated when light emitted in the light emitting layer is reflected at the first interface and the third interface or fourth interface may be defined as a Φ radian [wherein $-2n<\Phi\leq 0$]. As has been described previously, in the case where reflection is caused chiefly at the third interface which is an interface between the semi-transmissive reflective film 40 and the resistive layer 50, or alternatively, reflection is caused chiefly at the fourth interface which is an interface between the first resistive layer and the second resistive layer, the wordings "second interface constituted by an interface between the semi-transmissive reflective film and the organic layer" may be changed to "third interface constituted by an interface between the semi-transmissive reflective film and the resistive layer" or "fourth interface constituted by an interface between the first resistive layer and the second resistive layer".

Specifically, as a modification of the light emitting device in Example 1, a light emitting device having a structure shown in the following Table 12 using, as the resistive layer, a combination of a first resistive layer and a second resistive layer was prepared. As a result, reflection was caused at the third interface which is an interface between the semi-transmissive reflective film and the resistive layer and the fourth interface which is an interface between the first resistive layer and the second resistive layer, and the luminous efficiency became 1.3 times as compared with that in the light emitting device using, as the resistive layer, only the second resistive layer. A relation among a refractive index $n_1$ of the material constituting the first resistive layer, a refractive index $n_2$ of the material constituting the second resistive layer and a refractive index $n_0$ of the material constituting the uppermost layer of the organic layer is in a relation attaching importance to the following efficiency.

$-0.6\leq(n_0-n_1)\leq-0.4$ $0.4\leq(n_1-n_2)\leq 0.9$

TABLE 12

| | |
|---|---|
| Second substrate: | Soda glass |
| Adhesive layer: | Acrylic adhesive |
| Protective film: | $SiN_x$ layer (thickness: 5 μm) |
| Second electrode: | ITO layer (thickness: 0.1 μm) |
| Second resistive layer: | Thickness: 0.5 μm (refractive index $n_2$: 1.7) |
| First resistive layer: | Thickness: 0.06 μm (refractive index $n_1$: 2.4) |
| Semi-transmissive reflective film: | Mg—Ag film (thickness: 2 nm) |
| Organic layer (whole): | Thickness: 130 nm (refractive index $n_0$: 1.8) |
| Conductor film: | Mg—Ag film (thickness: 2 nm) |
| First electrode: | Al—Nd layer (thickness: 0.2 μm) |
| Interlayer insulating layer: | $SiO_2$ layer |
| TFT: | Constituting the organic EL device driving part |
| First substrate: | Soda glass |

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light emitting device comprising
   a first electrode,
   an organic layer having a light emitting layer made of an organic light emitting material provided therein,
   a semi-transmissive reflective film,
   a resistive layer, and
   a second electrode, all of which are laminated successively, wherein
   the organic layer has a structure in which an electron transport layer, a light emitting layer, a hole transport layer and a hole injection layer are laminated from the side of the first electrode,
   the first electrode reflects light from the light emitting layer,
   the second electrode transmits the light having been transmitted through the semi-transmissive reflective film therethrough, and
   an average film thickness of the semi-transmissive reflective film on the organic layer is from 1 nm to 6 nm.

2. The light emitting device according to claim 1, wherein the semi-transmissive reflective film contains magnesium and silver, or magnesium and calcium.

3. The light emitting device according to claim 1, wherein a portion of the organic layer coming into contact with the semi-transmissive reflective film contains a pyrazine derivative represented by the following formula (A):

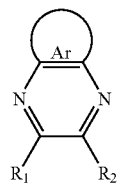

(A)

wherein

Ar represents an aryl group; each of $R_1$ and $R_2$ independently represents a substituent selected from the group consisting of hydrogen, a halogen, a hydroxyl group, an amino group, an arylamino group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a substituted or unsubstituted aryl group having not more than 30 carbon atoms, a substituted or unsubstituted heterocyclic group having not more than 30 carbon atoms, a nitrile group, a cyano group, a nitro group and a silyl group.

4. The light emitting device according to claim 1, wherein a conductor film is provided between the first electrode and the organic layer, and
an average film thickness of the conductor film on the first electrode is from 1 nm to 6 nm.

5. The light emitting device according to claim 1, wherein an electrical resistivity of a material constituting the resistive layer is from $1\times10^6$ Ω·m to $1\times10^{10}$ Ω·m, and
a thickness of the resistive layer above the organic layer is from 0.1 μm to 2 μm.

6. The light emitting device according to claim 1, wherein light emitted in the light emitting layer is resonated between a first interface constituted by an interface between the first electrode and the organic layer and a second interface constituted by an interface between the semi-transmissive reflective layer and the organic layer, and a part of the light is then outputted from the second electrode.

7. The light emitting device according to claim 1, wherein when an optical distance from a first interface constituted by an interface between the first electrode and the organic layer to a maximum light emitting position of the light emitting layer is defined as $OL_1$, and an optical distance from a second interface constituted by an interface between the semi-transmissive reflective layer and the organic layer to a maximum light emitting position of the light emitting layer is defined as $OL_2$, the following expressions (1-1) and (1-2) is satisfied:

$$0.7\{-\Phi_1/(2n)+m_1\} \leq (2\times OL_1)/\lambda \leq 1.2\{-\Phi_1/(2n)+m_1\} \quad (1\text{-}1)$$

$$0.7\{-\Phi_2/(2n)+m_2\} \leq (2\times OL_2)/\lambda \leq 1.2\{-\Phi_2/(2n)+m_2\} \quad (1\text{-}2)$$

wherein, $\lambda$ represents a maximum peak wavelength of a spectrum of light emitted in the light emitting layer;

$\Phi_1$ represents a phase shift amount (unit: radian) of reflected light generated at the first interface [wherein $-2n<\Phi_1 \leq 0$];

$\Phi_2$ represents a phase shift amount (unit: radian) of reflected light generated at the second interface [wherein $-2n<\Phi_2 \leq 0$]; and the $(m_1, m_2)$ value is (0, 0), (1, 0) or (0, 1).

8. The light emitting device according to claim 6, wherein when an optical distance between the first interface constituted by an interface between the first electrode and the organic layer and the second interface constituted by an interface between the semi-transmissive reflective layer and the organic layer is defined as OL, a sum of phase shifts generated when light emitted in the light emitting layer is reflected at the first interface and the second interface is defined as a $\Phi$ radian [wherein $-2n<\Phi \leq 0$], and a maximum peak wavelength of a spectrum of light emitted in the light emitting layer is defined as $\lambda$, either one of the following relations is satisfied:

$$0.7 \leq \{(2\times OL)/\lambda + \Phi/(2n)\} \leq 1.3$$

$$-0.3 \leq \{(2\times OL)/\lambda + \Phi/(2n)\} \leq 0.3.$$

* * * * *